US012701943B2

(12) United States Patent
Okumura et al.

(10) Patent No.: US 12,701,943 B2
(45) **Date of Patent: *Aug. 4, 2026**

(54) SURFACE TREATMENT METHOD FOR SEMICONDUCTOR SUBSTRATES AND SURFACE TREATMENT AGENT COMPOSITION

(71) Applicant: CENTRAL GLASS COMPANY, LIMITED, Ube (JP)

(72) Inventors: Yuzo Okumura, Ube (JP); Yuki Fukui, Ube (JP); Saori Shiota, Ube (JP); Yoshiharu Terui, Ube (JP); Soichi Kumon, Ube (JP)

(73) Assignee: CENTRAL GLASS COMPANY, LIMITED, Ube (JP)

( * ) Notice: Subject to any disclaimer, the term of this patent is extended or adjusted under 35 U.S.C. 154(b) by 852 days.

This patent is subject to a terminal disclaimer.

(21) Appl. No.: 17/999,363

(22) PCT Filed: May 19, 2021

(86) PCT No.: PCT/JP2021/018954

§ 371 (c)(1),
(2) Date: Nov. 18, 2022

(87) PCT Pub. No.: WO2021/235479

PCT Pub. Date: Nov. 25, 2021

(65) Prior Publication Data

US 2023/0282474 A1 Sep. 7, 2023

(30) Foreign Application Priority Data

May 21, 2020 (JP) ................................ 2020-089228
May 21, 2020 (JP) ................................ 2020-089232

(51) Int. Cl.
*H10P 70/00* (2026.01)

(52) U.S. Cl.
CPC .................................. *H10P 70/23* (2026.01)

(58) Field of Classification Search
None
See application file for complete search history.

(56) References Cited

U.S. PATENT DOCUMENTS 7,749,909 B2 7/2010 Tomita et al.
7,838,425 B2 11/2010 Tomita et al.
(Continued)

FOREIGN PATENT DOCUMENTS

JP 2009-194246 8/2009
JP 2010-040747 A 2/2010
(Continued)

OTHER PUBLICATIONS

Extended European Search Report, issued in the corresponding European patent application No. 21809616.2, dated Jun. 24, 2024, 8 pages.

(Continued)

*Primary Examiner* — Michael Lebentritt
(74) *Attorney, Agent, or Firm* — HSML P.C.

(57) ABSTRACT

A surface treatment method for semiconductor substrates of the present invention is a treatment method of treating a main surface of a semiconductor substrate that has, on the main surface of the substrate, a pattern formation region in which a pattern having a concave-convex structure with a pattern dimension of 30 nm or less is formed and a bevel region which is formed on a periphery of the pattern formation region, the method including a surface treatment step of bringing a surface treatment agent composition including a silylating agent into contact with the pattern formation region and the bevel region on the main surface of the semiconductor substrate, in which, with respect to a surface of a silicon oxide substrate brought into contact with (Continued)

the surface treatment agent composition, an IPA receding contact angle is 3° or more at a room temperature of 25° C., and/or a water receding contact angle is 40° or more at the room temperature of 25° C.

15 Claims, 3 Drawing Sheets

(56) References Cited

U.S. PATENT DOCUMENTS

| | | | |
|---|---|---|---|
| 7,985,683 B2 | 7/2011 | Tomita et al. | |
| 8,956,465 B2 | 2/2015 | Nonaka | |
| 2008/0241489 A1 | 10/2008 | Ishibashi et al. | |
| 2009/0250815 A1* | 10/2009 | Yang | H01L 21/76829 257/E23.162 |
| 2009/0311874 A1 | 12/2009 | Tomita et al. | |
| 2010/0075504 A1 | 3/2010 | Tomita et al. | |
| 2010/0240219 A1 | 9/2010 | Tomita et al. | |
| 2012/0171862 A1* | 7/2012 | Ou | H01L 23/53295 438/653 |
| 2013/0255534 A1 | 10/2013 | Ryokawa et al. | |
| 2014/0338706 A1 | 11/2014 | Nonaka | |
| 2017/0062203 A1 | 3/2017 | Ryokawa et al. | |
| 2018/0277357 A1 | 9/2018 | Wojtczak et al. | |
| 2020/0035494 A1 | 1/2020 | Wojtczak et al. | |

FOREIGN PATENT DOCUMENTS

| | | | | |
|---|---|---|---|---|
| JP | 2010-114414 | | 5/2010 | |
| JP | 2013118347 A | * | 6/2013 | C11D 11/0047 |
| JP | 2017-174859 | | 9/2017 | |
| JP | 2023027033 A | * | 3/2023 | B08B 3/08 |
| WO | 2013/080832 | | 6/2013 | |
| WO | 2013/132881 | | 9/2013 | |
| WO | WO-2015049956 A1 | * | 4/2015 | B08B 3/08 |
| WO | WO-2017030073 A1 | * | 2/2017 | C11D 3/162 |
| WO | WO-2017159407 A1 | * | 9/2017 | |
| WO | WO-2017159416 A1 | * | 9/2017 | |
| WO | WO-2017159447 A1 | * | 9/2017 | C07F 7/10 |
| WO | 2018/193841 | | 10/2018 | |
| WO | WO-2022181530 A1 | * | 9/2022 | C07F 7/02 |

OTHER PUBLICATIONS

International Search Report of PCT/JP2021/018954, Jul. 13, 2021, 2 pages.

Japanese Office Action, issued in the corresponding Japanese patent application No. 2022-524512, dated Feb. 18, 2025, 8 pages with the machine translation.

First Chinese Office Action and Search Report, issued in the corresponding Chinese patent application No. 202180036555.X, dated May 14, 2025, 30 pages with the machine translation.

Korean Office Action, issued in the corresponding Korean patent application No. 2022-7044865, dated Apr. 15, 2026, 24 pages.

* cited by examiner

SURFACE TREATMENT METHOD FOR SEMICONDUCTOR SUBSTRATES AND SURFACE TREATMENT AGENT COMPOSITION

TECHNICAL FIELD

The present invention relates to a surface treatment method for semiconductor substrates and a surface treatment agent composition.

BACKGROUND ART

So far, various developments have been made on a surface treatment method for semiconductor substrates. As this kind of technique, for example, a technique disclosed in Patent Document 1 has been known. Patent Document 1 discloses a surface treatment method for semiconductor substrates, in which, by forming a water-repellent protective film on a surface of a semiconductor substrate, the substrate is cleaned and dried while preventing a pattern from collapsing (paragraphs 0006, 0007, and the like of Patent Document). Specifically, FIG. 8 of Patent Document 1 indicates a graph showing a relationship between a cleaning sequence and a contact angle of water with respect to the pattern.

RELATED DOCUMENT

Patent Document

[Patent Document 1] Japanese Unexamined Patent Publication No. 2010-114414

SUMMARY OF THE INVENTION

Technical Problem

However, as a result of studies by the present inventor, it has been found that, in the surface treatment method for semiconductor substrates disclosed in Patent Document 1, there is room for improvement in terms of manufacturing stability.

Solution to Problem

As a result of further studies by the present inventor, the following findings have been obtained.

In a general structure at an edge portion of a semiconductor substrate, an angle formed with a top edge increases from 0 degrees to 90 degrees in a region of an upper bevel or a front shoulder from the top edge (approximately horizontal plane) to an end face (approximately vertical plane). That is, in the edge portion of the semiconductor substrate, an inclined surface having any angle of more than 0 degrees and 90 degrees or less is formed.

In a manufacturing process of the semiconductor substrate, in a case of subjecting a main surface having a pattern formation region in which a fine pattern is formed to a rinsing treatment with a rinsing solution such as water and an organic solvent, it has been found that the rinsing solution does not run out properly at the edge portion of the semiconductor substrate and there is a risk of wrapping around the rinsing solution to a back surface along with the inclined surface.

As a result of intensive studies based on such findings, it has been found that, by performing a surface treatment using a surface treatment agent composition which sets a receding contact angle of 2-propanol (hereinafter, also referred to as "IPA") and/or a receding contact angle of pure water to predetermined values on a bevel region formed on a periphery of the semiconductor substrate, liquid drainage characteristics of the rinsing solution in the bevel region can be controlled, and by adopting the IPA receding contact angle and/or the water receding contact angle as indexes, it is possible to stably evaluate the liquid drainage characteristics. Further, it has been found that, by setting the IPA receding contact angle and/or the water receding contact angle to a predetermined value or more, it is possible to suppress the rinsing solution from wrapping around to the back surface of the semiconductor substrate during the manufacturing process, and the present invention has been completed.

According to the present invention, there is provided a treatment method of treating a main surface of a semiconductor substrate that has, on the main surface of the substrate, a pattern formation region in which a pattern having a concave-convex structure with a pattern dimension of 30 nm or less is formed and a bevel region which is formed on a periphery of the pattern formation region, the method including a surface treatment step of bringing a surface treatment agent composition including a silylating agent into contact with the pattern formation region and the bevel region on the main surface of the semiconductor substrate, in which an IPA receding contact angle is 3° or more at a room temperature of 25° C. and/or a water receding contact angle is 40° or more at the room temperature of 25° C., which are obtained by the following procedure.

(Procedure)

A smooth surface of a silicon oxide substrate composed of silicon oxide is brought into contact with the surface treatment agent composition to perform a surface treatment. With respect to the surface-treated surface of the silicon oxide substrate in a state of being stood on a horizontal table, 3 μl of 2-propanol is dropped on the surface at the room temperature of 25° C. and a value of a contact angle 60 seconds later after the dropping is measured and defined as the IPA receding contact angle (°). In addition, with respect to the surface-treated surface of the silicon oxide substrate in a state of being stood on a horizontal table, 30 μl of pure water is dropped on the surface at the room temperature of 25° C., the pure water is sucked at a rate of 6 μl/sec, and a value of a contact angle while a droplet size is decreasing is measured and defined as the water receding contact angle (°).

In addition, according to the present invention, there is provided a surface treatment agent composition used for treating a main surface of a semiconductor substrate that has, on the main surface of the substrate, a pattern formation region in which a pattern having a concave-convex structure with a pattern dimension of 30 nm or less is formed and a bevel region which is formed on a periphery of the pattern formation region, the surface treatment agent composition including a silylating agent, in which an IPA receding contact angle is 3° or more at a room temperature of 25° C. and/or a water receding contact angle is 40° or more at the room temperature of 25° C., which are obtained by the above-described procedure.

Advantageous Effects of Invention

According to the present invention, a surface treatment method for semiconductor substrates, which is excellent in manufacturing stability, and a surface treatment agent composition used therein.

DESCRIPTION OF EMBODIMENTS

Figure 1:
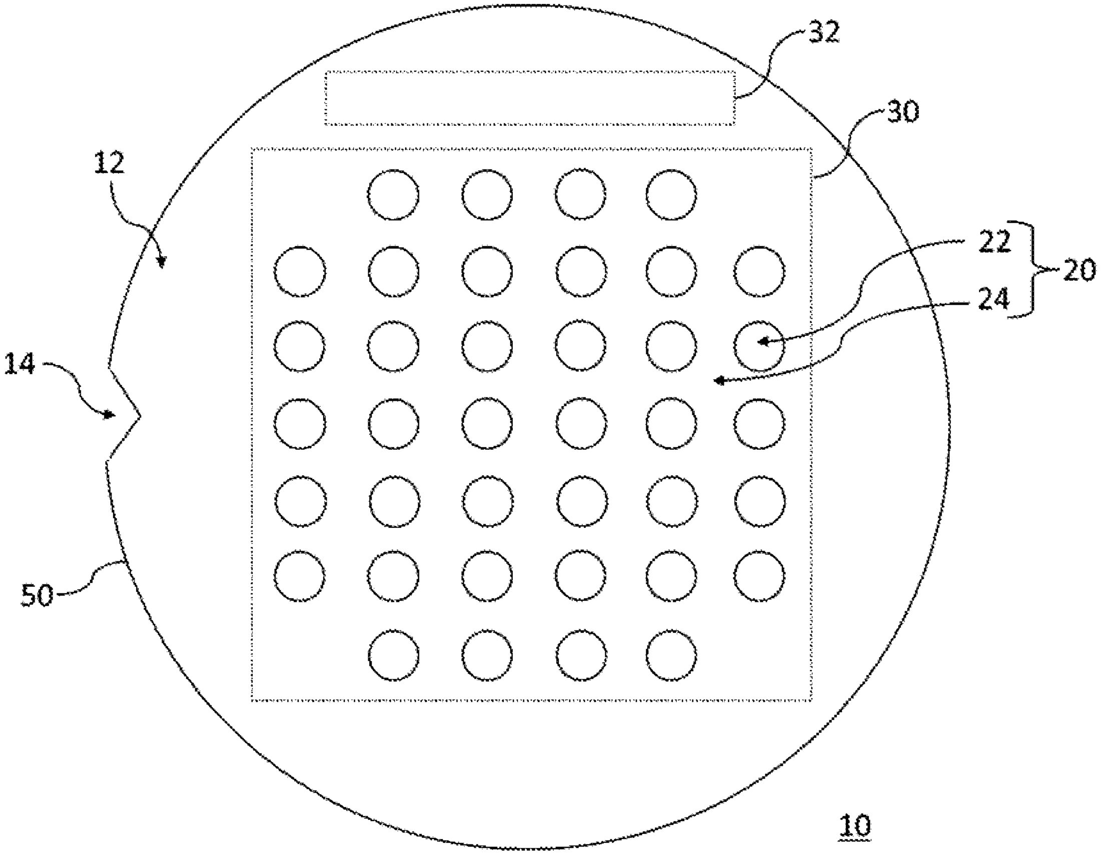
FIG. 1 is a top view schematically showing a configuration of a semiconductor substrate.

Hereinafter, embodiments of the present invention will be described with reference to the drawings. In all drawings, the same components are designated by the same reference numerals, and description thereof will not be repeated. In addition, the drawings are schematic views and do not match the actual dimensional ratio.

A surface treatment method for semiconductor substrates according to the present embodiment is a treatment method of treating a main surface of a semiconductor substrate that has, on the main surface of the substrate, a pattern formation region in which a pattern having a concave-convex structure with a pattern dimension of 30 nm or less is formed and a bevel region which is formed on a periphery of the pattern formation region.

The treatment method includes a surface treatment step of bringing a surface treatment agent composition including a silylating agent into contact with the pattern formation region and the bevel region on the main surface of the semiconductor substrate, in which an IPA receding contact angle is 3° or more at a room temperature of 25° C. and/or a water receding contact angle is 40° or more at the room temperature of 25° C., which are obtained by the following procedure.

Patent Document 1 described above does not disclose at all that a water-repellent protective film is formed on a bevel on a peripheral portion of a wafer. On the other hand, the present inventors have found that, by increasing the IPA receding contact angle and/or the water receding contact angle with the surface treatment agent composition used for the surface treatment of the bevel, ease of liquid drainage of the rinsing solution is improved at the edge portion of the wafer.

According to the findings of the present inventors, it has been found that, by adopting the receding contact angle of 2-propanol (hereinafter, also referred to as an IPA receding contact angle) and/or the receding contact angle of pure water (hereinafter, also referred to as a water receding contact angle) as indexes indicating characteristics of the surface treatment agent composition used on the bevel region formed on the periphery of the semiconductor substrate, the liquid drainage characteristics of the rinsing solution in the bevel region can be controlled. As a result of further studies, it has been found that, by setting the IPA receding contact angle and/or the water receding contact angle to the above-described lower limit values or more, it is possible to suppress the rinsing solution from wrapping around to the back surface of the semiconductor substrate during the manufacturing process.

In a case of a spin method, in a case where the last supplied solution turns over before a drying step, since it is necessary to sufficiently dry a backside part in addition to the main surface, from the studies of the present inventor, it has been found that a drying time may be longer. Therefore, it has been found that a smaller amount of the solution turning over before the drying step is desirable.

The detailed mechanism is not clear, however by increasing the IPA receding contact angle and/or the water receding contact angle moderately, the ease of flow of the rinsing solution on the inclined surface surface-treated with the surface treatment agent composition can be appropriately controlled. Therefore, for example, in a case of trying to shake off the rinsing solution such as IPA and water using spin, the rinsing solution which has flowed out from the top edge can be shaken off well with a front bevel and the front shoulder before reaching the end face. Accordingly, it is considered that the rinsing solution can be prevented from wrapping around to the back surface through the end face.

In the treatment method according to the present embodiment, in a case of rinsing the surface of the semiconductor substrate with an aqueous rinsing solution or a non-aqueous rinsing solution such as alcohol, for example, IPA after the surface treatment, the liquid drainage of the rinsing solution on the inclined surface is good. Therefore, in a case of a spin cleaning, it is possible to suppress the rinsing solution from wrapping around to the back surface of the semiconductor substrate, so that the manufacturing stability can be improved.

In addition, isopropanol (IPA) or water may be used as a rinsing solution after the surface treatment ("second rinsing solution" described later), and in such an embodiment, in order to improve ease of IPA or water drainage, the present inventors have found that it is desirable that the IPA receding contact angle of a surface treatment agent layer formed by the surface treatment is larger and/or the water receding contact angle of the surface treatment agent layer formed by the surface treatment is larger.

In addition, in some embodiments, a rinsing may be performed sequentially with water and IPA as rinsing solutions after the surface treatment ("second rinsing solution" described later) (for example, "surface treatment→water rinse→IPA rinse", "surface treatment→IPA rinse→water rinse", or the like), in such an embodiment, the present inventors have found that a larger IPA receding contact angle and/or a larger water receding contact angle is desired.

The IPA receding contact angle is 3° or more, preferably 5° or more, more preferably 6° or more, and still more preferably 7° or more at the room temperature of 25° C., and/or the water receding contact angle is 40° or more, preferably 50° or more, more preferably 60° or more, and still more preferably 70° or more at the room temperature of 25° C.

As a result, it is possible to suppress the wraparound of the rinsing solution to the back surface of the semiconductor substrate.

On the other hand, the above-described IPA receding contact angle may be, for example, 20° or less, and the above-described water receding contact angle may be, for example, 100° or less.

In addition, a standard deviation of the IPA receding contact angle on the predetermined 10 surfaces can be configured to be, for example, 5° or less. A difference between the maximum value and the minimum value of the IPA receding contact angle can be configured to be, for example, 10° or less.

Similarly, a standard deviation of the water receding contact angle on the predetermined 10 surfaces can be configured to be, for example, 5° or less. A difference between the maximum value and the minimum value of the water receding contact angle can be configured to be, for example, 10° or less.

A treatment method according to another embodiment of the present invention is a treatment method of treating a main surface of a semiconductor substrate that has, on the main surface of the substrate, a pattern formation region in which a pattern having a concave-convex structure with a pattern dimension of 30 nm or less is formed and a bevel region which is formed on a periphery of the pattern formation region, the method including a surface treatment step of bringing a surface treatment agent composition including a silylating agent into contact with the pattern formation region and the bevel region on the main surface of the semiconductor substrate and an evaluation step of determining whether or not an IPA receding contact angle is 3° or more and/or a water receding contact angle is 40° or more on the main surface of the semiconductor substrate after the surface treatment step.

In the evaluation step of the above-described aspect, the IPA receding contact angle and/or the water receding contact angle may be measured and determined in a region of the above-described main surface, in which the pattern is not formed (non-pattern region).

In addition, in the evaluation step of the above-described aspect, a result of measuring the IPA receding contact angle and/or the water receding contact angle with respect to a substrate (dummy substrate) having a smooth surface composed of the same material as the main surface of the semiconductor substrate may be adopted and determined.

According to the above-described aspect, by including the evaluation step of the IPA receding contact angle and/or the water receding contact angle in the treatment method (measurement in the non-pattern region for each substrate treatment or for each fixed number of substrate treatments, or measurement with the dummy substrate for each fixed number of substrate treatments), it can be confirmed for each substrate whether the surface treatment step of bringing the surface treatment agent composition into contact is properly performed. Therefore, in a case where an abnormality occurs in a specific substrate among the substrates treated by the treatment method according to the present embodiment so that the amount of backing cannot be suppressed, it is easy to isolate the cause of whether the above-described surface treatment step is not properly performed or the subsequent step of shaking off the rinsing solution is not properly performed.

In addition, a contact angle of the 2-propanol on the surface of the substrate surface-treated with the surface treatment agent composition is preferably 2° or more and 10° or less and more preferably 3° or more and 10° or less at the room temperature of 25° C. As a result, it is possible to reduce a pattern collapse rate in the pattern formation region.

Similarly, a lower limit of the water contact angle on the surface of the substrate surface-treated with the surface treatment agent composition is, for example, preferably 50° or more and more preferably 60° or more at the room temperature of 25° C. As a result, it is possible to reduce a pattern collapse rate in the pattern formation region. On the other hand, an upper limit of the above-described water contact angle is not particularly limited, but may be, for example, 110° or less at the room temperature of 25° C.

According to the present embodiment, by bringing the surface treatment agent composition into contact with the main surface in the surface treatment step, a surface treatment agent layer can be formed on the main surface of the substrate. As a result, a pattern collapse can be suppressed by the surface treatment agent layer on the pattern formation region, and the backing to the back surface can be suppressed by the surface treatment agent layer on the bevel region.

In addition, in the manufacturing process of forming a semiconductor element on the semiconductor substrate (wafer), it is known that foreign matter (particles) such as metal particles and inorganic particles adhere to the bevel or the like located at the edge portion of the semiconductor wafer.

By forming the surface treatment agent layer having the above-described IPA receding contact angle and/or water receding contact angle also on the pattern non-formation region and/or the bevel region, it is possible to reduce reattachment of the foreign matters to the bevel region or the pattern non-formation region.

In addition, a surface treatment agent composition according to the present embodiment is used for treating a main surface of a semiconductor substrate that has, on the main surface of the substrate, a pattern formation region in which a pattern having a concave-convex structure with a pattern dimension of 30 nm or less is formed and a bevel region which is formed on a periphery of the pattern formation region.

Such a surface treatment agent composition includes a silylating agent and is configured to set an IPA receding contact angle obtained by the following procedure is 3° or more at a room temperature of 25° C., and/or a water receding contact angle obtained by the following procedure is 40° or more at the room temperature of 25° C.

The IPA receding contact angle on the surface of the substrate surface-treated with the surface treatment agent composition is determined by the following procedure.

The surface treatment agent composition is brought into contact with a smooth surface of a silicon oxide substrate composed of silicon oxide to perform a surface treatment.

With respect to the surface-treated surface of the silicon oxide substrate in a state of being stood on a horizontal table, 3 μl of 2-propanol is dropped on the surface at the room temperature of 25° C. and a value of a contact angle 60 seconds later after the dropping is measured, and a value thereof is defined as the IPA receding contact angle (°).

Since the 2-propanol dries 60 seconds later after a droplet is dropped and a contact area between the droplet and the substrate is reduced, the contact angle at that time can be regarded as the IPA receding contact angle.

In addition, the water receding contact angle on the surface of the substrate surface-treated with the surface treatment agent composition is determined by the following procedure.

The surface treatment agent composition is brought into contact with a smooth main surface of a silicon oxide substrate composed of silicon oxide to perform a surface treatment.

With respect to the surface-treated surface of the silicon oxide substrate in a state of being stood on a horizontal table, 30 μl of pure water is dropped on the surface at the room temperature of 25° C., and the pure water is sucked at a rate of 6 μl/sec to reduce a droplet size. Contact angles of the droplet during this process are continuously measured, and a contact angle in a case where a droplet size decreases without changing the contact angle is investigated, and a value thereof defined as the water receding contact angle (°).

The surface of the silicon oxide substrate is preferably an oxide film, but other components such as unavoidable silicon may be slightly present.

In the film forming process of the film constituting the semiconductor element in the pattern formation region, a silicon or silicon nitride film may be present in the bevel region or the end face, or a film in which different materials are mixed may be exposed. Even in such a case, by using the surface treatment agent composition which gives the IPA receding contact angle and/or the water receding contact angle, it is possible to stably suppress the wraparound of the rinsing solution to the back surface of the semiconductor substrate.

As the measurement substrate used for measuring the IPA receding contact angle and the water receding contact angle, a smooth substrate composed of the same material as the main surface of the semiconductor substrate may be separately used. In addition, in a case of a semiconductor substrate having a pattern non-formation region with a smooth surface, the same substrate as the semiconductor substrate may be used, that is, the measurement may be performed on the pattern non-formation region of the semiconductor substrate.

In addition, the IPA contact angle or the water contact angle of the main surface surface-treated with the surface treatment agent composition are determined by the following procedure.

The surface treatment agent composition is brought into contact with a smooth surface of a silicon oxide substrate (evaluation substrate) composed of silicon oxide to perform a surface treatment.

With respect to the surface-treated surface of the silicon oxide substrate in a state of being stood on a horizontal table, 1 μl of 2-propanol or pure water is dropped on the surface at the room temperature of 25° C. and a value of a static contact angle 5 seconds later after the dropping is measured, and a value thereof is defined as the IPA contact angle (°) or the water contact angle (°).

As the evaluation substrate of the IPA contact angle or the water contact angle, a substrate having the same conditions as the IPA receding contact angle or the water receding contact angle can be used.

The procedure for measuring the receding contact angle and the contact angle described above is usually used to evaluate characteristics of the surface treatment agent composition.

In the above-described evaluation step in the treatment method, measurement conditions of one point selected from any of a measurement temperature of the receding contact angle and the contact angle of 23° C.±5° C., a droplet amount of 0.1 μl to 5 μl, and a measurement timing after the dropping of 0.1 seconds to 30 seconds can be applied to the procedure for measuring the receding contact angle and the contact angle described above.

In the present embodiment, for example, by appropriately selecting the type and blending amount of each component included in the surface treatment agent composition, the preparation method of the surface treatment agent composition, or the like, it is possible to control the IPA receding contact angle, the water receding contact angle, the IPA contact angle, and the water contact angle described above. Among these, examples of a factor for setting the IPA receding contact angle, the water receding contact angle, the IPA contact angle, and the water contact angle described above into a desired numerical range include appropriately selecting the type of the silylating agent and other components and mixing composition components and using immediately after the preparation.

In the present specification, "immediately after" or "immediately before" means within 24 hours, preferably within 2 hours and particularly preferably within 30 minutes.

By the surface treatment method using the surface treatment agent composition according to the present embodiment, it is possible to realize a method for manufacturing a semiconductor substrate having excellent manufacturing controllability and manufacturing stability.

(Method for Manufacturing Semiconductor Substrate)

Hereinafter, the method for manufacturing a semiconductor substrate according to the present embodiment will be described in detail.

Examples of the method for manufacturing a semiconductor substrate include a method of performing, on a main surface of a semiconductor substrate, a pattern formation, a pre-rinsing (first rinsing) step, a surface treatment step with a surface treatment agent composition, a post-rinsing (second rinsing) step, a drying step, a removal of a surface treatment agent layer, and the like.

Hereinafter, each step will be described with reference to FIGS. 1 to 3.

FIG. 1 is a top view of a substrate 10 (semiconductor substrate) from a direction perpendicular to a main surface 12. FIG. 2 is a schematic cross-sectional view of the substrate 10 in a predetermined direction. FIGS. 3A to 3C are schematic process cross-sectional views in a process of manufacturing the semiconductor substrate.

First, the substrate 10 having a pattern (concave-convex structure 20) formed on the main surface 12 is prepared.

In the above-described preparation step of the substrate 10, the following method, which is an example of a method of forming the concave-convex structure 20 on the surface of the substrate 10, may be used.

First, a resist is applied to a surface of a wafer, and then the resist is exposed through a resist mask. Thereafter, by removing the exposed resist or the unexposed resist, a resist having a desired concave-convex pattern is produced. In addition, the resist having a concave-convex pattern can also be obtained by pressing a mold having a pattern against the resist. Next, the wafer is etched. At this time, the substrate surface corresponding to the concave portion of the resist pattern is selectively etched. Finally, in a case of peeling off the resist, a wafer (substrate 10) having the concave-convex structure 20 on the surface is obtained.

The wafer on which the concave-convex structure 20 is formed and the material of the concave-convex structure 20 are not particularly limited.

As the material of the wafer, various wafers such as a silicon wafer, a silicon carbide wafer, a wafer composed of a plurality of components including a silicon element, a sapphire wafer, and a semiconductor wafer including various compounds can be used.

As the material of the concave-convex structure 20, one or two or more kinds selected from the group consisting of Si, Ti, Ge, W, Ru, and oxides, nitrides, nitrogen oxides, carbonitrides, or carbide oxides, which include one or more kinds of these elements, may be included. For example, as the material of the concave-convex structure 20, silicon-based materials such as silicon oxide, silicon nitride, polycrystalline silicon, single crystalline silicon, and silicon germanium; metal-based materials such as titanium nitride, tungsten, ruthenium, tantalum nitride, and tin; materials obtained by combining these materials; resist (photoresist) materials; and the like can be used.

The substrate 10 of FIG. 1 has, on the main surface 12, a pattern formation region 30 in which the pattern (concave-convex structure 20) is formed and a pattern non-formation region 32 in which the pattern is not formed. As a matter of course, the treatment target may be a substrate having no pattern non-formation region.

In the substrate 10 of FIG. 1, a notch portion 14 may be formed in a part of the peripheral portion. For the purpose of positioning in an exposure apparatus or the like, the notch portion 14 may be formed with a straight cut called as an orientation flat, which indicates a direction of a crystal axis, or a V-shaped cut called as a notch.

The pattern formation region 30 is a region in which one or two or more concave-convex structures 20 are formed in a case of being viewed from a direction perpendicular to the main surface 12, that is, in a top view. The pattern formation region 30 may include an element formation region in which one or two or more semiconductor elements are formed.

For example, the concave-convex structure 20 may be constituted of one or two or more structures arranged along a vertical direction of the main surface 12 and/or of a three-dimensional structure having one or two or more structures arranged along a horizontal direction orthogonal to the vertical direction. As an example of such a three-dimensional structure, at least a part of a logic device or a memory device may be configured, and examples thereof include FinFETs, nanowire FETs, nanosheet FETs, other multigate FETs, and three-dimensional memory cells.

The pattern non-formation region 32 is a region formed on at least a part of an outer circumference of the pattern formation region 30 or the entire outer circumference thereof in the top view. The pattern non-formation region 32 may be formed continuously with each other or may be divided into a plurality of portions.

The pattern non-formation region 32 has a smooth surface region in which the concave-convex structure 20 is not formed at least in part.

In the pattern formation region 30 and/or between the pattern formation region 30 and the pattern non-formation region 32, one or two or more cut regions for dicing may be formed.

Figure 2:
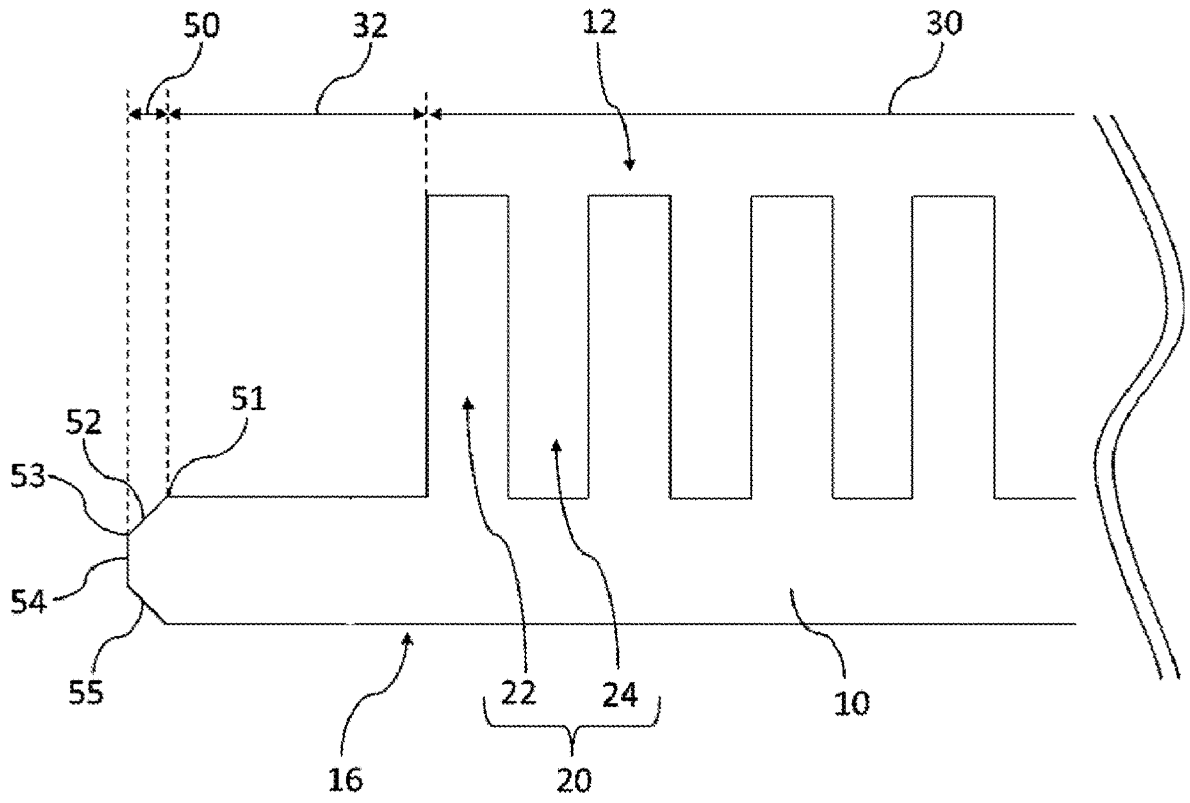
FIG. 2 is a cross-sectional view schematically showing a configuration of a semiconductor substrate.
Figure 3A:
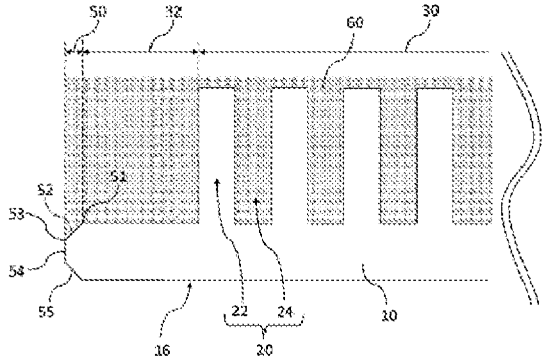
FIG. 3A to 3C are process cross-sectional views schematically showing a manufacturing process of the semiconductor substrate.
Figure 3B:
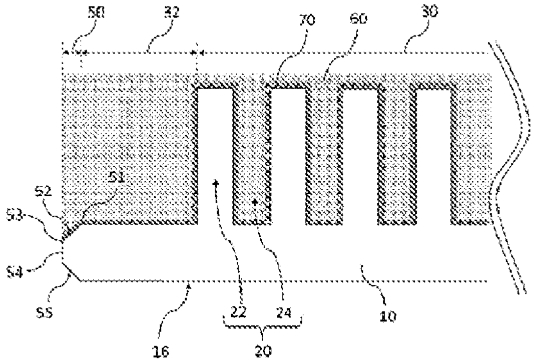
Figure 3C:
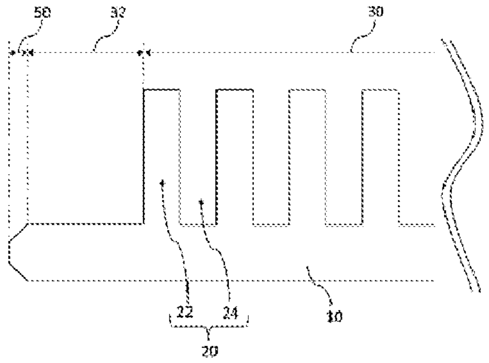

FIG. 2 is a cross-sectional view showing an example of the concave-convex structure 20.

In the present embodiment, a pattern dimension of the concave-convex structure 20 is defined as at least one dimension in a width direction of an in-plane direction of the main surface 12 and/or at least one dimension in a height direction of a direction perpendicular to the main surface 12.

At least one or more pattern dimensions of the width and the height in the cross-sectional structure (in a thickness direction of the substrate) of the pattern of the concave-convex structure 20, or at least one or more pattern dimensions of the width (length in an X-axis direction), the height (length in a Y-axis direction), and the depth (length in a Z-axis direction) in the three-dimensional structure (three-dimensional coordinates of XYZ) in the pattern of the concave-convex structure 20 may be, for example, 30 nm or less, 20 nm or less, or 10 nm or less. These may be a spacing between the patterns. Even in a case where the substrate 10 having such a fine concave-convex structure 20 used, the surface treatment agent composition according to the present embodiment can be applied.

Such a surface treatment agent composition is suitable, for example, for a surface treatment of the substrate 10 having the concave-convex structure 20 having a pattern dimension of 30 nm or less, preferably 20 nm or less.

An aspect ratio of a convex portion 22 may be, for example, 3 or more, 5 or more, or 10 or more. Even in the concave-convex structure which has the convex portion 22 having a fragile structure, the pattern collapse can be suppressed.

On the other hand, the aspect ratio of the convex portion 22 is not particularly limited, but may be 100 or less.

The aspect ratio of the convex portion 22 is represented by a value obtained dividing the height of the convex portion 22 by the width of the convex portion 22.

As shown in FIGS. 1 and 2, the substrate 10 has a bevel region 50 formed in at least a part of the edge portion of the substrate 10. It is sufficient that the bevel region 50 include an inclined surface (bevel) formed on the main surface 12, and for example, the bevel region 50 include a top edge 51, an upper bevel 52, a front shoulder 53, an end face 54, and a lower bevel 55.

Subsequently, the main surface 12 of the substrate 10 may be brought into contact with an aqueous cleaning solution as necessary (cleaning step).

Examples of the aqueous cleaning solution include water, alcohol, an ammonium hydroxide aqueous solution, a tetramethylammonium aqueous solution, a hydrochloric acid aqueous solution, a hydrogen peroxide aqueous solution, a sulfuric acid aqueous solution, and an organic solvent. These may be used alone or in combination of two or more kinds thereof.

The cleaning step may be performed once or twice or more before the surface treatment step or before a first rinsing step. Other steps may be included between a plurality of cleaning steps or between the cleaning step and the surface treatment step.

Subsequently, the main surface 12 of the substrate 10 may be brought into contact with a first rinsing solution as necessary (first rinsing step). As the first rinsing solution, a cleaning solution different from the aqueous cleaning solution can be used, and examples thereof include water, an organic solvent, a mixture thereof, and a solution thereof mixed with at least one of an acid, an alkali, a surfactant, and an oxidizing agent.

Examples of the organic solvent used in the first rinsing solution include hydrocarbons, esters, ethers, ketones, halogen element-containing solvents, sulfoxide-based solvents, alcohols, derivatives of polyhydric alcohol, and nitrogen element-containing solvents. Among these, as the organic solvent, it is preferable to use at least one selected from an alcohol having 3 or less carbon atoms, such as methanol, 1-propanol, and 2-propanol (isopropanol).

In addition, a plurality of types may be used as the first rinsing solution. For example, the rinsing can be performed in the order of a solution including an acid aqueous solution or an alkali aqueous solution→an organic solvent. In addition, the rinsing may be performed by adding the aqueous cleaning solution so as to be in the order of a solution including an acid aqueous solution or an alkali aqueous solution→the aqueous cleaning solution→an organic solvent.

The first rinsing step may be performed once or twice or more after the cleaning step or before the surface treatment step. Other steps may be included between a plurality of first rinsing steps or between the first rinsing step and the surface treatment step.

Subsequently, as shown in FIG. 3A, the surface treatment agent composition 60 according to the present embodiment is brought into contact with the main surface 12 of the substrate 10 (surface treatment agent composition).

It is preferable to supply the liquid surface treatment agent composition 60 to the concave-convex structure 20 formed on the surface of the substrate 10. In this case, the liquid surface treatment agent composition 60 may be supplied so as to fill a part or all of a concave portion 24 of the concave-convex structure 20.

The surface treatment agent composition 60 may be supplied in a state in which the first rinsing solution or the aqueous cleaning solution is held on the main surface 12. That is, by replacing the first rinsing solution or the aqueous cleaning solution with the surface treatment agent composition 60, the surface treatment step can be performed before the surface of the concave-convex structure 20 on the main surface 12 of the substrate 10 is dried.

Examples of a method of supplying the surface treatment agent composition 60 include a single wafer method typified by a spin method (spin coating method) in which a composition is supplied near a center of rotation while wafers are held one by one substantially horizontally and rotated to replace a cleaning solution or the like held in a concave-convex pattern of the wafer, so that the composition is filled.

Subsequently, as shown in FIG. 3B, a surface treatment agent layer 70 can be formed on the main surface 12 of the substrate 10 by bringing the surface treatment agent composition 60 into contact with the main surface 12.

As necessary, known methods such as heating treatment, decompression treatment, and drying treatment may be applied to the surface treatment agent composition 60 on the main surface 12 to promote the formation of the surface treatment agent layer 70.

The surface treatment agent layer 70 is formed in the pattern formation region 30 and the bevel region 50 on the main surface 12 of the substrate 10, and in a case where the substrate 10 has the pattern non-formation region 32, the surface treatment agent layer 70 may be formed in the pattern non-formation region 32 as well. In addition, the surface treatment agent layer 70 may be formed on the end face 54 or the lower bevel 55.

Subsequently, the main surface 12 on which the surface treatment agent layer 70 may be brought into contact with a second rinsing solution as necessary (second rinsing step).

As the second rinsing solution, those mentioned for the first rinsing solution can be used.

In addition, a plurality of types may be used as the second rinsing solution. For example, the rinsing can be performed in the order of water→an organic solvent such as isopropanol.

The second rinsing step may be performed once or twice or more after the surface treatment step. Other steps may be included between a plurality of second rinsing steps or between the second rinsing step and the surface treatment step.

Subsequently, a drying step of drying the main surface 12 of the substrate 10 may be performed as necessary.

By the drying step, the liquid existing on the main surface 12 of the substrate 10 can be removed.

As a drying method, for example, known methods such as a spin drying method, an IPA (2-propanol) steam drying, a Marangoni drying, a heat drying, a warm air drying, and a vacuum drying may be used.

The drying step may be performed once or twice or more, and for example, may be performed after the surface treatment step or after the second rinsing step. The drying step and the second rinsing step may be repeated alternately.

Subsequently, as shown in FIG. 3C, the surface treatment agent layer 70 on the main surface 12 of the substrate 10 may be removed (removal step).

Examples of a removing method include heating, UV irradiation, ozone exposure, plasma irradiation, and corona discharge. In addition, a treatment with a concentrated fluid such as a supercritical fluid (which may include an acid, abase, or an oxidizing agent) or a steam treatment may be performed. These may be used alone or in combination of two or more kinds thereof. These treatments may be performed under atmospheric pressure or reduced pressure.

As a result, a semiconductor substrate (substrate 10) using the surface treatment agent composition according to the present embodiment can be obtained.

The manufacturing method shown in FIGS. 3A to 3C targets a wafer pattern, but the present invention is not limited thereto. In the method for manufacturing a substrate according to the present embodiment, it is also possible to suppress a resist pattern from collapsing by using the surface treatment agent composition according to the embodiment of the present invention in the cleaning and drying step of the resist pattern.

Although the above-described supply step has been described as a manufacturing method performed after the cleaning step, the present invention is not limited thereto, and the supply step may be performed after various treatments performed on the concave-convex structure 20.

As the method for manufacturing a substrate, one or a combination of two or more known treatments may be used in addition to the above-described steps. For example, after the above-described removal step, a surface treatment such as a plasma treatment may be performed.

Next, the surface treatment agent composition used for the above-described surface treatment of the semiconductor substrate will be described.

The surface treatment agent composition according to the present embodiment includes a silylating agent.

As the above-described silylating agent, a known silylating agent can be used. As the silylating agent, for example, a silicon compound represented by General Formula [1] is used. These may be used alone or in combination of two or more kinds thereof.

$$R^1_aSi(H)_bX_{4-a-b} \quad [1]$$

In General Formula [1], $R^1$'s each independently represent an organic group including a hydrocarbon group having 1 to 18 carbon atoms, in which a part or all of hydrogen elements may be replaced with fluorine elements, X's each independently represent a monovalent organic group in which an element bonded to an Si element is nitrogen, oxygen, carbon, or halogen, a represents an integer of 1 to 3, b represents an integer of 0 to 2, and a sum of a and b is 1 to 3.

$R^1$ in General Formula [1] may include not only hydrogen, carbon, nitrogen, oxygen, and fluorine elements, but also a silicon element, a sulfur element, a halogen element (other than fluorine), and the like.

In addition, $R^1$ in General Formula [1] may include an unsaturated bond, an aromatic ring, or a cyclic structure.

Examples of $R^1$ in General Formula [1] each independently include at least one group selected from $C_eH_{2e+1}$ (e=1 to 18) and $C_fF_{2f+1}CH_2CH_2$ (f=1 to 8). Among these, a silicon compound having a trialkylsilyl group can be used.

In a case where $R^1$ in General Formula [1] includes a silicon element, a structure of General Formula [1-1] below may be adopted.

$$R^1_mX_{3-m-n}(H)_nSi—(CH_2)_p—Si(H)_nX_{3-m-n}R^1_m \quad [1\text{-}1]$$

In General Formula [1-1], $R^1$'s (however, a silicon element is not included in $R^1$'s) and X are the same as in General Formula [1], m represents an integer of 1 or 2, n represents an integer of 0 or 1, the sum of m and n is 1 or 2, p represents an integer of 1 to 18, and a methylene chain represented by $—(CH_2)_p—$ may be substituted with halogen.

In X in General Formula [1], the monovalent organic group in which the element bonded to the Si element is nitrogen, oxygen, or carbon includes not only hydrogen, carbon, nitrogen, and oxygen elements, but also a silicon element, a sulfur element, a halogen element, and the like.

Examples of the above-described monovalent organic group in which the element bonded to the Si element is nitrogen include an isocyanate group, an amino group, a dialkylamino group, an isothiocyanate group, an azido group, an acetamide group, —NHC(═O) $CF_3$, —N($CH_3$) C(═O) $CH_3$, —N($CH_3$) C(═O) $CF_3$, —N═C($CH_3$) OSi $(CH_3)_3$, —N═C($CF_3$) OSi$(CH_3)_3$, —NHC(═O)—OSi $(CH_3)_3$, —NHC(═O)—NH—Si$(CH_3)_3$, an imidazole ring, a triazole ring, a tetrazole ring, an oxazolidinone ring, a morpholine ring, —NH—C(═O)—Si$(CH_3)_3$, —N(S $(=O)_2R^4)_2$ (here, $R^4$'s each independently represent a group selected from the group consisting of a monovalent hydrocarbon group having 1 to 8 carbon atoms, in which a part or all of hydrogen elements may be replaced with fluorine elements, and a fluorine element), a substituent having a structure of General Formula [1-2]

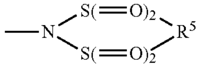

[1-2]

(in General Formula [1-2], $R^5$'s each independently represent a divalent hydrocarbon group having 1 to 8 carbon atoms, in which a part or all of hydrogen elements may be replaced with fluorine elements), —N═C$(NR^6{}_2)_2$, —N═C $(NR^6{}_2)$ $R^6$ (here, $R^6$'s are each independently selected from a hydrogen group, a —C≡N group, a —$NO_2$ group, and a hydrocarbon group in which a part or all of hydrogen elements may be replaced with fluorine elements; the hydrocarbon group may have an oxygen atom and/or a nitrogen atom), —N($R^{a1}$) ($R^{a2}$) (here, Rai represents a hydrogen atom or a saturated or unsaturated alkyl group, and $R^{a2}$ represents a saturated or unsaturated alkyl group, a saturated or unsaturated cycloalkyl group, or a saturated or unsaturated heterocycloalkyl group; Rai and $R^{a2}$ may be bonded to each other to form a saturated or unsaturated heterocycloalkyl group having a nitrogen atom), —N($R^{a3}$)—Si($R^{a4}$) ($R^{a5}$) ($R^{a6}$) (here, $R^{a3}$ represents a hydrogen atom, a hydrocarbon group having 1 to 4 carbon atoms, a trimethylsilyl group, or a dimethylsilyl group, $R^{a4}$, $R^{a5}$, and $R^{a6}$ each independently represent a hydrogen atom or an organic group, and the total number of carbon atoms included in $R^{a4}$, $R^{a5}$, and $R^{a6}$ is 1 or more), and —N($R^{a7}$)—C(═O) $R^{a8}$ (here, $R^{a7}$ represents a hydrogen atom, a methyl group, a trimethylsilyl group, or a dimethylsilyl group, and $R^{a8}$ represents a hydrogen atom, a saturated or unsaturated alkyl group, a fluorine-containing alkyl group, or a trialkylsilylamino group).

Examples of a silylating agent that X in General Formula [1] is a monovalent organic group in which the element bonded to the Si element is nitrogen include $CH_3Si(NH_2)_3$, $C_2H_5Si(NH_2)_3$, $C_3H_7Si(NH_2)_3$, $C_4H_9Si(NH_2)_3$, $C_5H_{11}Si(NH_2)_3$, $C_6H_{13}Si(NH_2)_3$, $C_7H_{15}Si(NH_2)_3$, $C_8H_{17}Si(NH_2)_3$, $C_9H_{19}Si(NH_2)_3$, $C_{10}H_{21}Si(NH_2)_3$, $C_{11}H_{23}Si(NH_2)_3$, $C_{12}H_{25}Si(NH_2)_3$, $C_{13}H_{27}Si(NH_2)_3$, $C_{14}H_{29}Si(NH_2)_3$, $C_{15}H_{31}Si(NH_2)_3$, $C_{16}H_{33}Si(NH_2)_3$, $C_{17}H_{35}Si(NH_2)_3$, $C_{18}H_{37}Si(NH_2)_3$, $(CH_3)_2Si(NH_2)_2$, $C_2H_5Si(CH_3)$ $(NH_2)_2$, $(C_2H_5)_2Si(NH_2)_2$, $C_3H_7Si(CH_3)$ $(NH_2)_2$, $(C_3H_7)_2Si(NH_2)_2$, $C_4H_9Si(CH_3)$ $(NH_2)_2$, $(C_4H_9)_2Si(NH_2)_2$, $C_5H_{11}Si(CH_3)$ $(NH_2)_2$, $C_6H_{13}Si(CH_3)$ $(NH_2)_2$, $C_7H_{15}Si(CH_3)$ $(NH_2)_2$, $C_8H_{17}Si(CH_3)$ $(NH_2)_2$, $C_9H_{19}Si(CH_3)$ $(NH_2)_2$, $C_{10}H_{21}Si$ $(CH_3)$ $(NH_2)_2$, $C_{11}H_{23}Si(CH_3)$ $(NH_2)_2$, $C_{12}H_{25}Si(CH_3)$ $(NH_2)_2$, $C_{13}H_{27}Si(CH_3)$ $(NH_2)_2$, $C_{14}H_{29}Si(CH_3)$ $(NH_2)_2$, $C_{15}H_{31}Si(CH_3)$ $(NH_2)_2$, $C_{16}H_{33}Si(CH_3)$ $(NH_2)_2$, $C_{17}H_{35}Si$ $(CH_3)$ $(NH_2)_2$, $C_{18}H_{37}Si(CH_3)$ $(NH_2)_2$, $(CH_3)_3SiNH_2$, $C_2H_5Si(CH_3)_2NH_2$, $(C_2H_5)_2Si(CH_3)$ $NH_2$, $(C_2H_5)_3SiNH_2$, $C_3H_7Si(CH_3)_2NH_2$, $(C_3H_7)_2Si(CH_3)NH_2$, $(C_3H_7)_3SiNH_2$, $C_4H_9Si(CH_3)_2NH_2$, $(C_4H_9)_3SiNH_2$, $C_5H_{11}Si(CH_3)_2NH_2$, $C_6H_{13}Si(CH_3)_2NH_2$, $C_7H_{15}Si(CH_3)_2NH_2$, $C_8H_{17}Si(CH_3)_2$ $NH_2$, $C_9H_{19}Si(CH_3)_2NH_2$, $C_{10}H_{21}Si(CH_3)_2NH_2$, $C_{11}H_{23}Si$ $(CH_3)_2NH_2$, $C_{12}H_{25}Si(CH_3)_2NH_2$, $C_{13}H_{27}Si(CH_3)_2NH_2$, $C_{14}H_{29}Si(CH_3)_2NH_2$, $C_{15}H_{31}Si(CH_3)_2NH_2$, $C_{16}H_{33}Si$ $(CH_3)_2NH_2$, $C_{17}H_{35}Si(CH_3)_2NH_2$, $C_{18}H_{37}Si(CH_3)_2NH_2$, $(CH_3)_2Si(H)$ $NH_2$, $CH_3Si(H)_2NH_2$, $(C_2H_5)_2Si(H)$ $NH_2$, $C_2H_5Si(H)_2NH_2$, $C_2H_5Si(CH_3)$ (H) $NH_2$, $(C_3H_7)_2Si(H)$ $NH_2$, $C_3H_7Si(H)_2NH_2$, $CF_3CH_2CH_2Si(NH_2)_3$, $C_2F_5CH_2CH_2Si(NH_2)_3$, $C_3F_7CH_2CH_2Si(NH_2)_3$, $C_4F_9CH_2CH_2Si(NH_2)_3$, $C_5F_{11}CH_2CH_2Si(NH_2)_3$, $C_6F_{13}CH_2CH_2Si(NH_2)_3$, $C_7F_{15}CH_2CH_2Si(NH_2)_3$, $C_8F_{17}CH_2CH_2Si(NH_2)_3$, $CF_3CH_2CH_2Si(CH_3)$ $(NH_2)_2$, $C_2F_5CH_2CH_2Si(CH_3)$ $(NH_2)_2$, $C_3F_7CH_2CH_2Si(CH_3)$ $(NH_2)_2$, $C_4F_9CH_2CH_2Si(CH_3)$ $(NH_2)_2$, $C_5F_{11}CH_2CH_2Si$ $(CH_3)$ $(NH_2)_2$, $C_6F_{13}CH_2CH_2Si(CH_3)$ $(NH_2)_2$, $C_7F_{15}CH_2CH_2Si(CH_3)$ $(NH_2)_2$, $C_8F_{17}CH_2CH_2Si(CH_3)$ $(NH_2)_2$, $CF_3CH_2CH_2Si(CH_3)_2NH_2$, $C_2F_5CH_2CH_2Si(CH_3)_2$ $NH_2$, $C_3F_7CH_2CH_2Si(CH_3)_2NH_2$, $C_4F_9CH_2CH_2Si(CH_3)_2$ $NH_2$, $C_5F_{11}CH_2CH_2Si(CH_3)_2NH_2$, $C_6F_{13}CH_2CH_2Si(CH_3)_2$ $NH_2$, $C_7F_{15}CH_2CH_2Si(CH_3)_2NH_2$, $C_8F_{17}CH_2CH_2Si(CH_3)_2$ $NH_2$, $CF_3CH_2CH_2Si(CH_3)$ $(H)NH_2$, aminosilanes such as aminodimethylvinylsilane, aminodimethylphenylethylsilane, aminodimethylphenylsilane, aminomethyldiphenylsilane, and aminodimethyl-t-butylsilane, and a group in which an amino group (—$NH_2$ group) in the aminosilane is replaced with —N═C═O, a dialkylamino group (—N $(CH_3)_2$, —N$(C_2H_5)_2$, and the like), a t-butylamino group, an allylamino group, —N═C═S, —$N_3$, —NHC(═O)$CH_3$, —NHC(═O)$CF_3$, —N($CH_3$) C(═O) $CH_3$, —N($CH_3$) C(═O) $CF_3$, —N═C($CH_3$) OSi$(CH_3)_3$, —N═C($CF_3$) OSi $(CH_3)_3$, —NHC(═O)—OSi$(CH_3)_3$, —NHC(═O)—NH—Si$(CH_3)_3$ (for example, N,N'-bis(trimethylsilyl)urea and the like), an imidazole ring (for example, N-trimethylsilylimidazole and the like), a triazole ring (for example, N-trimethylsilyltriazole), a tetrazole ring, an oxazolidinone ring, a morpholine ring, —NH—C(═O)—Si$(CH_3)_3$, —N(S(═O) ${}_2R^4)_2$ (here, $R^4$'s each independently represent a group selected from the group consisting of a monovalent hydrocarbon group having 1 to 8 carbon atoms, in which a part or all of hydrogen elements may be replaced with fluorine elements, and a fluorine element; for example, N-(trimethylsilyl)bis(trifluoromethanesulfonyl)imide and the like), a substituent having a structure of General Formula [1-2]

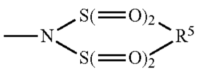

[1-2]

(in General Formula [1-2], $R^5$'s each independently represent a divalent hydrocarbon group having 1 to 8 carbon atoms, in which a part or all of hydrogen elements may be replaced with fluorine elements; for example, N-(trimethylsilyl) N,N-difluoromethane-1,3-bis(sulfonyl)imide and the like), —N═C$(NR^6{}_2)_2$, —N═C$(NR^6{}_2)R^6$ (here, $R^6$'s are each independently selected from a hydrogen group, a —C≡N group, a —$NO_2$ group, and a hydrocarbon group in which a part or all of hydrogen elements may be replaced with fluorine elements; the hydrocarbon group may have an oxygen atom and/or a nitrogen atom; for example, 2-trimethylsilyl-1,1,3,3-tetramethylguanidine and the like), —N($R^{a1}$) ($R^{a2}$) (here, $R^{a1}$ represents a hydrogen atom or a saturated or unsaturated alkyl group, and $R^{a2}$ represents a saturated or unsaturated alkyl group, a saturated or unsaturated cycloalkyl group, or a saturated or unsaturated heterocycloalkyl group; $R^{a1}$ and $R^{a2}$ may be bonded to each other to form a saturated or unsaturated heterocycloalkyl group having a nitrogen atom), $—N(R^{a3})—Si(R^{a4})(R^{a5})(R^{a6})$ (here, $R^{a3}$ represents a hydrogen atom, a hydrocarbon group having 1 to 4 carbon atoms, a trimethylsilyl group, or a dimethylsilyl group, $R^{a4}$, $R^{a5}$, and $R^{a6}$ each independently represent a hydrogen atom or an organic group, and the total number of carbon atoms included in $R^{a4}$, $R^{a5}$, and $R^{a6}$ is 1 or more; for example, hexamethyldisilazane, N-methylhexamethyldisilazane, 1,1,3,3-tetramethyldisilazane, 1,3-dimethyldisilazane, 1,3-di-N-octyltetramethyldisilazane, 1,3-divinyltetramethyldisilazane, heptamethyldisilazane, N-allyl-N,N-bis(trimethylsilyl)amine, 1,3-diphenyltetramethyldisilazane, 1,1,3,3-tetraphenyl-1,3-dimethyldisilazane, nonamethyltrisilazane, pentamethylethyldisilazane, pentamethylvinyldisilazane, pentamethylpropyldisilazane, pentamethylethyldisilazane, pentamethyl-t-butyldisilazane, pentamethylphenyldisilazane, trimethyltriethyldisilazane, and the like), or $—N(R^{a7})—C(=O)R^{a8}$ (here, $R^{a7}$ represents a hydrogen atom, a methyl group, a trimethylsilyl group, or a dimethylsilyl group, and $R^{a8}$ represents a hydrogen atom, a saturated or unsaturated alkyl group, a fluorine-containing alkyl group, or a trialkylsilylamino group; for example, N-trimethylsilylacetamide, N-trimethylsilyltrifluoroacetamide, N-methyl-N-trimethylsilylacetamide, N-methyl-N-trimethylsilyltrifluoroacetamide, bis(trimethylsilyl)acetamide, bis(trimethylsilyl)trifluoroacetamide, and the like).

Examples of a silylating agent that X in General Formula [1] is a monovalent organic group in which the element bonded to the Si element is oxygen include a group in which the amino group ($—NH_2$ group) in the above-described aminosilane is replaced with $—O—C(=A)R^{a9}$ (here, A represents O, $CHR^{a10}$, $CHOR^{a10}$, $CR^{a10}R^{a10}$, or $NR^{a11}$, $R^{a9}$ and $R^{a10}$ each independently represent a hydrogen atom, a saturated or unsaturated alkyl group, a saturated or unsaturated cycloalkyl group, a fluorine-containing alkyl group, a chlorine-containing alkyl group, a trialkylsilyl group, a trialkylsiloxy group, an alkoxy group, a phenyl group, a phenylethyl group, or an acetyl group, and $R^{a11}$ represents a hydrogen atom, an alkyl group, or a trialkylsilyl group; for example, trimethylsilyl acetate, dimethylsilylacetate, monomethylsilylacetate, trimethylsilyltrifluoroacetate, dimethylsilyltrifluoroacetate, monomethylsilyltrifluoroacetate, trimethylsilyltrichloroacetate, trimethylsilylpropionate, trimethylsilyl butyrate, and the like), $—O—C(R^{a12})=N(R^{a13})$ (here, $R^{a12}$ represents a hydrogen atom, a saturated or unsaturated alkyl group, a fluorine-containing alkyl group, or a trialkylsilylamino group, and $R^{a13}$ represents a hydrogen atom, an alkyl group, or a trialkylsilyl group), $—O—C(R^{a14})=CH—C(=O)R^{a15}$ (here, $R^{a14}$ and $R^{a15}$ each independently represent a hydrogen atom or an organic group; for example, trimethylsilyloxy-3-penten-2-one, 2-trimethylsiloxypent-2-en-4-one, and the like), $—OR^{a16}$ (here, $R^{a16}$ represents a saturated or unsaturated alkyl group, a saturated or unsaturated cycloalkyl group, or a fluorine-containing alkyl group; for example, alkylmethoxysilanes such as $CH_3Si(OCH_3)_3$, $C_2H_5Si(OCH_3)_3$, $C_3H_7Si(OCH_3)_3$, $C_4H_9Si(OCH_3)_3$, $C_5H_{11}Si(OCH_3)_3$, $C_6H_{13}Si(OCH_3)_3$, $C_7H_{15}Si(OCH_3)_3$, $C_8H_{17}Si(OCH_3)_3$, $C_9H_{19}Si(OCH_3)_3$, $C_{10}H_{21}Si(OCH_3)_3$, $C_{11}H_{23}Si(OCH_3)_3$, $C_{12}H_{25}Si(OCH_3)_3$, $C_{13}H_{27}Si(OCH_3)_3$, $C_{14}H_{29}Si(OCH_3)_3$, $C_{15}H_{31}Si(OCH_3)_3$, $C_{16}H_{33}Si(OCH_3)_3$, $C_{17}H_{35}Si(OCH_3)_3$, $C_{18}H_{37}Si(OCH_3)_3$, $(CH_3)_2Si(OCH_3)_2$, $C_2H_5Si(CH_3)(OCH_3)_2$, $(C_2H_5)_2Si(OCH_3)_2$, $C_3H_7Si(CH_3)(OCH_3)_2$, $(C_3H_7)_2Si(OCH_3)_2$, $C_4H_9Si(CH_3)(OCH_3)_2$, $(C_4H_9)_2Si(OCH_3)_2$, $C_5H_{11}Si(CH_3)(OCH_3)_2$, $C_6H_{13}Si(CH_3)(OCH_3)_2$, $C_7H_{15}Si(CH_3)(OCH_3)_2$, $C_8H_{17}Si(CH_3)(OCH_3)_2$, $C_9H_{19}Si(CH_3)(OCH_3)_2$, $C_{10}H_{21}Si(CH_3)(OCH_3)_2$, $C_{11}H_{23}Si(CH_3)(OCH_3)_2$, $C_{12}H_{25}Si(CH_3)(OCH_3)_2$, $C_{13}H_{27}Si(CH_3)(OCH_3)_2$, $C_{14}H_{29}Si(CH_3)(OCH_3)_2$, $C_{15}H_{31}Si(CH_3)(OCH_3)_2$, $C_{16}H_{33}Si(CH_3)(OCH_3)_2$, $C_{17}H_{35}Si(CH_3)(OCH_3)_2$, $C_{18}H_{37}Si(CH_3)(OCH_3)_2$, $(CH_3)_3SiOCH_3$, $C_2H_5Si(CH_3)_2OCH_3$, $(C_2H_5)_2Si(CH_3)OCH_3$, $(C_2H_5)_3SiOCH_3$, $C_3H_7Si(CH_3)_2OCH_3$, $(C_3H_7)_2Si(CH_3)OCH_3$, $(C_3H_7)_3SiOCH_3$, $C_4H_9Si(CH_3)_2OCH_3$, $(C_4H_9)_3SiOCH_3$, $C_5H_{11}Si(CH_3)_2OCH_3$, $C_6H_{13}Si(CH_3)_2OCH_3$, $C_7H_{15}Si(CH_3)_2OCH_3$, $C_8H_{17}Si(CH_3)_2OCH_3$, $C_9H_{19}Si(CH_3)_2OCH_3$, $C_{10}H_{21}Si(CH_3)_2OCH_3$, $C_{11}H_{23}Si(CH_3)_2OCH_3$, $C_{12}H_{25}Si(CH_3)_2OCH_3$, $C_{13}H_{27}Si(CH_3)_2OCH_3$, $C_{14}H_{29}Si(CH_3)_2OCH_3$, $C_{15}H_{31}Si(CH_3)_2OCH_3$, $C_{16}H_{33}Si(CH_3)_2OCH_3$, $C_{17}H_{35}Si(CH_3)_2OCH_3$, $C_{18}H_{37}Si(CH_3)_2OCH_3$, $(CH_3)_2Si(H)OCH_3$, $CH_3Si(H)_2OCH_3$, $(C_2H_5)_2Si(H)OCH_3$, $C_2H_5Si(H)_2OCH_3$, $C_2H_5Si(CH_3)(H)OCH_3$, and $(C_3H_7)_2Si(H)OCH_3$, fluoroalkylmethoxysilanes such as $CF_3CH_2CH_2Si(OCH_3)_3$, $C_2F_5CH_2CH_2Si(OCH_3)_3$, $C_3F_7CH_2CH_2Si(OCH_3)_3$, $C_4F_9CH_2CH_2Si(OCH_3)_3$, $C_5F_{11}CH_2CH_2Si(OCH_3)_3$, $C_6F_{13}CH_2CH_2Si(OCH_3)_3$, $C_7F_{15}CH_2CH_2Si(OCH_3)_3$, $C_8F_{17}CH_2CH_2Si(OCH_3)_3$, $CF_3CH_2CH_2Si(CH_3)(OCH_3)_2$, $C_2F_5CH_2CH_2Si(CH_3)(OCH_3)_2$, $C_3F_7CH_2CH_2Si(CH_3)(OCH_3)_2$, $C_4F_9CH_2CH_2Si(CH_3)(OCH_3)_2$, $C_5F_{11}CH_2CH_2Si(CH_3)(OCH_3)_2$, $C_6F_{13}CH_2CH_2Si(CH_3)(OCH_3)_2$, $C_7F_{15}CH_2CH_2Si(CH_3)(OCH_3)_2$, $C_8F_{17}CH_2CH_2Si(CH_3)(OCH_3)_2$, $CF_3CH_2CH_2Si(CH_3)_2OCH_3$, $C_2F_5CH_2CH_2Si(CH_3)_2OCH_3$, $C_3F_7CH_2CH_2Si(CH_3)_2OCH_3$, $C_4F_9CH_2CH_2Si(CH_3)_2OCH_3$, $C_5F_{11}CH_2CH_2Si(CH_3)_2OCH_3$, $C_6F_{13}CH_2CH_2Si(CH_3)_2OCH_3$, $C_7F_{15}CH_2CH_2Si(CH_3)_2OCH_3$, $C_8F_{17}CH_2CH_2Si(CH_3)_2OCH_3$, and $CF_3CH_2CH_2Si(CH_3)(H)OCH_3$, a compound in which the methyl group portion of the methoxy group of methoxysilane is replaced with a monovalent hydrocarbon group having 2 to 18 carbon atoms, in which a part or all of hydrogen elements may be replaced with fluorine elements, and the like), $—O—S(=O)_2—R^{a17}$ (here, $R^{a17}$ represents an alkyl group having 1 to 6 carbon atoms, a perfluoroalkyl group, a phenyl group, a tolyl group, or a $—O—Si(CH_3)_3$ group; for example, trimethylsilylsulfonate, trimethylsilylbenzenesulfonate, trimethylsilyltoluenesulfonate, trimethylsilyltrifluoromethanesulfonate, trimethylsilylperfluorobutanesulfonate, bistrimethylsilylsulfate, and the like), or $—O—P(—O—Si(CH_3)_3)_2$ (for example, tristrimethylsilylphosphite).

In addition, examples of the silylating agent that X in General Formula [1] is a monovalent organic group in which the element bonded to the Si element is oxygen also include siloxane compounds such as hexamethyldisiloxane, 1,3-diphenyl-1,3-dimethyldisiloxane, 1,1,3,3-tetramethyldisiloxane, 1,1,1-triethyl-3,3-dimethyldisiloxane, 1,1,3,3-tetra-n-octyldimethyldisiloxane, bis(nonafluorohexyl)tetramethyldisiloxane, 1,3-bis(trifluoropropyl)tetramethyldisiloxane, 1,3-di-n-butyltetramethyldisiloxane, 1,3-di-n-octyltetramethyldisiloxane, 1,3-diethyltetramethyldisiloxane, 1,3-diphenyltetramethyldisiloxane, hexa-n-butyldisiloxane, hexaethyldisiloxane, hexavinyldisiloxane, 1,1,3,3-tetraisopropyldisiloxane, vinylpentamethyldisiloxane, 1,3-bis(3-chloroisobutyl)tetramethyldisiloxane, hexaphenyldisiloxane, 1,1,1-triethyl-3,3,3-trimethyldisiloxane, 1,3-bis(chloromethyl)tetramethyldisiloxane, 1,1,3,3-tetraphenyldimethyldisiloxane, pentamethyldisiloxane, 1,3-bis(3-chloropropyl)tetramethyldisiloxane, 1,3-dichloro-1,3-diphenyl-1,3-dimethyldisiloxane, n-butyl-1,1,3,3-tetramethyldisiloxane, 1,3-di-t-butyldisiloxane, vinyl-1,1,3,3,-tetramethyldisiloxane, 1,1,1-trimethyl-3,3,3-triphenyldisiloxane, 3,3-diphenyltetramethyltrisiloxane, 3-phenylheptamethyltrisiloxane, hexamethylcyclotrisiloxane, n-propylheptamethyltrisiloxane, 3-ethylheptamethyltrisiloxane, 3-(3,3,3-trifluoropropyl)heptamethyltrisiloxane, 1,1,3,5,5-pentaphenyl-1,3,5-trimethyltrisiloxane, octamethyltrisiloxane, 1,1,5,5-tetraphenyl-1,3,3,5-tetramethyltrisiloxane, hexaphenylcyclotrisiloxane, 1,1,1,5,5,5-hexamethyltrisiloxane, 3-phenyl-1,1,3,5,5-pentamethyltrisiloxane, 1,3,5-trivinyl-1,1,3,5,5-pentamethyltrisiloxane, 1,3,5-trivinyl-1,3,5-trimethylcyclotrisiloxane, 3-octylheptamethyltrisiloxane, 1,3,5-triphenyltrimethylcyclotrisiloxane, 1,1,1,3,3,5,5-heptamethyltrisiloxane, 1,1,3,3,5,5-hexamethyltrisiloxane, 1,1,1,5,5,5-hexaethyl-3-methyltrisiloxane, furfuryloxytrisiloxane, tetrakis(dimethylsiloxy) silane, 1,1,3,3,5,5,7,7-octamethyltetrasiloxane, diphenylsiloxane-dimethylsiloxane copolymer, 1,3-diphenyl-1,3-dimethyldisiloxane, octamethylcyclotetrasiloxane, 1,3-bis (trimethylsiloxy)-1,3-dimethyldisiloxane, tetra-n-propyltetramethylcyclotetrasiloxane, octaethylcyclotetrasiloxane, decamethyltetrasiloxane, dodecamethylcyclohexasiloxane, dodecamethylpentasiloxane, tetradecamethylhexasiloxane, hexaphenylcyclotrisiloxane, polydimethylsiloxane, polyoctadecylmethylsiloxane, decamethylcyclopentasiloxane, poly (3,3,3-trifluoropropylmethylsiloxane), polydimethylsiloxane terminalized with trimethylsiloxy, and 1,1,3,3,5,5,7,7,9,9-decamethylpentasiloxane.

Examples of a silylating agent that X in General Formula [1] is a monovalent organic group in which the element bonded to the Si element is carbon include a group in which the amino group (—$NH_2$ group) in the above-described aminosilane is replaced with —$C(S(=O)_2R^7)_3$ (here, $R^7$'s each independently represent a group selected from the group consisting of a monovalent hydrocarbon group having 1 to 8 carbon atoms, in which a part or all of hydrogen elements may be replaced with fluorine elements, and a fluorine element; for example, (trimethylsilyl)tris(trifluoromethanesulfonyl)methide and the like).

In addition, examples of a silylating agent that X in General Formula [1] is a monovalent organic group in which the element bonded to the Si element is halogen include a group in which the amino group (—$NH_2$ group) in the above-described aminosilane is replaced with a chloro group, a bromo group, or an iodo group (for example, chlorotrimethylsilane, bromotrimethylsilane, and the like).

As the above-described silylating agent, a cyclic silazane compound can be included.

Examples of the above-described cyclic silazane compound include cyclic disilazane compounds such as 2,2,5,5-tetramethyl-2,5-disila-1-azacyclopentane and 2,2,6,6-tetramethyl-2,6-disila-1-azacyclohexane; cyclic trisilazane compounds such as 2,2,4,4,6,6-hexamethylcyclotrisilazane and 2,4,6-trimethyl-2,4,6-trivinylcyclotrisilazane; and cyclic tetrasilazane compounds such as 2,2,4,4,6,6,8,8-octamethylcyclotetrasilazane.

In addition to the above-described silylating agent, the above-described surface treatment agent composition can include, as a catalyst of the silylating agent, one or more kinds selected from the group consisting of a compound A described later, an acid imidized product, a nitrogen-containing compound, a nitrogen-containing heterocyclic compound not including a silicon atom, and a silylated heterocyclic compound. Here, the catalyst promotes the reaction between the above-described main surface and the silylating agent or enhances water-repellent performance of the surface treatment agent layer to be formed, and the catalyst itself or a modified product may form a part of the surface treatment agent layer.

A concentration of the above-described catalyst may be, for example, 0.005% by mass or more and 20% by mass or less or 0.05% by mass or more and 15% by mass or less with respect to 100% by mass of the above-described surface treatment agent composition.

Specific examples of the above-described compound A include trimethylsilyltrifluoroacetate,
trimethylsilyltrifluoromethanesulfonate,
dimethylsilyltrifluoroacetate,
dimethylsilyltrifluoromethanesulfonate,
butyldimethylsilyltrifluoroacetate,
butyldimethylsilyltrifluoromethanesulfonate,
hexyldimethylsilyltrifluoroacetate,
hexyldimethylsilyltrifluoromethanesulfonate,
octyldimethylsilyltrifluoroacetate,
octyldimethylsilyltrifluoromethanesulfonate,
decyldimethylsilyltrifluoroacetate, and
decyldimethylsilyltrifluoromethanesulfonate, and one or more kinds selected from these compounds can be included. These may be used alone or in combination of two or more kinds thereof.

The above-described compound A may correspond to the above-described silylating agent, but in a case of being used as a catalyst, it means that the compound A is used in combination with other silylating agents other than the compound A.

The above-described compound A may be a compound obtained by reacting a silicon compound represented by General Formula [2] with one or more acetic acids or sulfonic acids selected from the group consisting of trifluoroacetic acid, trifluoroacetic acid anhydride, trifluoromethanesulfonic acid, and trifluoromethanesulfonic acid anhydride.

A surplus silicon compound represented by General Formula [2], which remains without being consumed in this reaction, can be used as the above-described silylating agent together with the compound A obtained in the reaction. The silicon compound represented by General Formula [2] may be reacted with the above-described acetic acids or sulfonic acids at a molar ratio of, for example, 0.2 to 100000 molar times, preferably 0.5 to 50000 molar times and more preferably 1 to 10000 molar times.

$$R^2_c(H)_dSi—X \quad [2]$$

In General Formula [2], examples of $R^2$, $(H)_dSi$— include $(CH_3)_3Si$—, $(CH_3)_2(H)Si$—, $(C_4H_9)(CH_3)_2Si$—, $(C_6H_{13})(CH_3)_2Si$—, $(C_8H_{17})(CH_3)_2Si$—, and $(C_{10}H_{21})(CH_3)_2Si$—. In addition, X is the same as in General Formula [1] described above.

In addition, the above-described compound A may be at least one kind selected from the group consisting of a sulfonic acid represented by General Formula [3], an anhydride of the sulfonic acid, a salt of the sulfonic acid, and a sulfonic acid derivative represented by General Formula [4].

$$R^8—S(=O)_2OH \quad [3]$$

[in General Formula [3], $R^8$ represents a group selected from the group consisting of a monovalent hydrocarbon group having 1 to 8 carbon atoms, in which a part or all of hydrogen elements may be replaced with fluorine elements, and a hydroxyl group]

$$R^{8'}—S(=O)_2O—Si(H)_{3-r}(R^9)_r \quad [4]$$

[in General Formula [4], $R^{8'}$ represents a monovalent hydrocarbon group having 1 to 8 carbon atoms, in which a part or all of hydrogen elements may be replaced with fluorine elements, $R^9$'s each independently represent at least one group selected from monovalent hydrocarbon groups having 1 to 18 carbon atoms, in which a part or all of hydrogen elements may be replaced with fluorine elements, and r represents an integer of 1 to 3]

In addition, the above-described compound A may be at least one kind selected from the group consisting of a sulfonate represented by General Formula [5], a sulfonimide represented by each of General Formulae [6] and [7], sulfonimide derivatives represented by General Formulae [8] and [9], a sulfonmethide represented by General Formula [10], and a sulfonmethide derivative represented by General Formula [11].

$R^{10}—S(=O)_2OR^{11}$ [5]

[in General Formula [5], $R^{10}$ represents a group selected from the group consisting of a monovalent hydrocarbon group having 1 to 8 carbon atoms, in which a part or all of hydrogen elements may be replaced with fluorine elements, and a fluorine element, and $R^{11}$ represents a monovalent alkyl group having 1 to 18 carbon atoms]

$(R^{12}—S(=O)_2)_2NH$ [6]

[in General Formula [6], $R^{12}$'s each independently represent a group selected from the group consisting of a monovalent hydrocarbon group having 1 to 8 carbon atoms, in which a part or all of hydrogen elements may be replaced with fluorine elements, and a fluorine element]

[7]

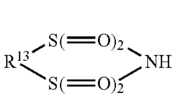

[in General Formula [7], $R^{13}$ represents a divalent hydrocarbon group having 1 to 8 carbon atoms, in which a part or all of hydrogen elements may be replaced with fluorine elements]

$((R^{14}—S(=O)_2)_2N)_sSi(H)_t(R^{15})_{4-s-t}$ [8]

[in General Formula [8], $R^{14}$'s each independently represent a group selected from the group consisting of a monovalent hydrocarbon group having 1 to 8 carbon atoms, in which a part or all of hydrogen elements may be replaced with fluorine elements, and a fluorine element, $R^{15}$'s each independently represent a monovalent hydrocarbon group having 1 to 18 carbon atoms, in which a part or all of hydrogen elements may be replaced with fluorine elements, s represents an integer of 1 to 3, t represents an integer of 0 to 2, and a sum of s and t is 3 or less]

[9]

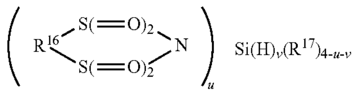

[in General Formula [9], $R^{16}$'s each independently represent a divalent hydrocarbon group having 1 to 8 carbon atoms, in which a part or all of hydrogen elements may be replaced with fluorine elements, $R^{17}$'s each independently represent a monovalent hydrocarbon group having 1 to 18 carbon atoms, in which apart or all of hydrogen elements may be replaced with fluorine elements, u represents an integer of 1 to 3, v represents an integer of 0 to 2, and a sum of u and v is 3 or less]

$(R^{18}—S(=O)_2)_3CH$ [10]

[in General Formula [10], $R^{18}$'s each independently represent a group selected from the group consisting of a monovalent hydrocarbon group having 1 to 8 carbon atoms, in which a part or all of hydrogen elements may be replaced with fluorine elements, and a fluorine element]

$((R^{19}—S(=O)_2)_3C)_wSi(H)_x(R^{20})_{4-w-x}$ [11]

[in General Formula [11], $R^{19}$'s each independently represent a group selected from the group consisting of a monovalent hydrocarbon group having 1 to 8 carbon atoms, in which a part or all of hydrogen elements may be replaced with fluorine elements, and a fluorine element, $R^{20}$'s each independently represent a monovalent hydrocarbon group having 1 to 18 carbon atoms, in which a part or all of hydrogen elements may be replaced with fluorine elements, w represents an integer of 1 to 3, x represents an integer of 0 to 2, and a sum of w and x is 3 or less]

In addition, examples of the above-described acid imidized product include compounds having a chemical structure in which an acid such as a carboxylic acid and a phosphoric acid is imidized.

In addition, examples of the above-described nitrogen-containing compound include at least one kind of compounds represented by General Formulae [12] and [13].

$R^{21}—N=C(NR^{22}_2)_2$ [12]

$R^{21}—N=C(NR^{22}_2)R^{22}$ [13]

[in General Formulae [12] and [13], $R^{21}$ is selected from a hydrogen group, a —C≡N group, a —$NO_2$ group, an alkylsilyl group, and a hydrocarbon group in which a part or all of hydrogen elements may be replaced with fluorine elements, where the hydrocarbon group may have an oxygen atom and/or a nitrogen atom, but in a case of including a nitrogen atom, the hydrocarbon group has an acyclic structure; $R^{22}$'s are each independently selected from a hydrogen group, a —C≡N group, a —$NO_2$ group, and a hydrocarbon group in which a part or all of hydrogen elements may be replaced with fluorine elements, where the hydrocarbon group may have an oxygen atom and/or a nitrogen atom, but in a case of including a nitrogen atom, the hydrocarbon group has an acyclic structure]

In addition, examples of the above-described nitrogen-containing compound include guanidine, 1,1,3,3-tetramethylguanidine, 2-tert-butyl-1,1,3,3-tetramethylguanidine, 1,3-diphenylguanidine, 1,2,3-triphenylguanidine, N,N'-diphenylformamidine, and 2,2,3,3,3-pentafluoropropylamidine.

In addition, examples of the nitrogen-containing heterocyclic compound not including a silicon atom and the silylated heterocyclic compound include at least one kind of compounds represented by General Formulae [14] and [15].

[14]

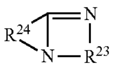

[in General Formula [14], $R^{23}$ and $R^{24}$ each independently represent a divalent organic group composed of a carbon element and/or a nitrogen element, and a hydrogen element, the total number of carbon elements and nitrogen elements is 1 to 9, and in a case of 2 or more, a carbon element which does not form a ring may be present]

[15]

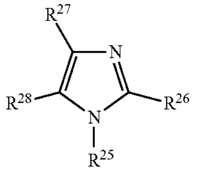

[in General Formula [15], $R^{25}$ represents an alkyl group having 1 to 6 carbon atoms, in which a part or all of hydrogen elements may be replaced with fluorine elements, a trialkylsilyl group having an alkyl group having 1 to 8 carbon atoms, in which a part or all of hydrogen elements may be replaced with fluorine elements, an alkenyl group having 2 to 6 carbon atoms, in which a part or all of hydrogen elements may be replaced with fluorine elements, an alkoxy group having 1 to 6 carbon atoms, in which a part or all of hydrogen elements may be replaced with fluorine elements, an amino group, an alkylamino group having an alkyl group having 1 to 6 carbon atoms, in which a part or all of hydrogen elements may be replaced with fluorine elements, a dialkylamino group having an alkyl group having 1 to 6 carbon atoms, in which a part or all of hydrogen elements may be replaced with fluorine elements, an aminoalkyl group having 1 to 6 carbon atoms, in which a part or all of hydrogen elements may be replaced with fluorine elements, a nitro group, a cyano group, a phenyl group, a benzyl group, or a halogen group, and $R^{26}$, $R^{27}$, and $R^{28}$ each independently represent an alkyl group having 1 to 6 carbon atoms, in which a part or all of hydrogen elements may be replaced with fluorine elements, or a hydrogen group]

In addition, the above-described nitrogen-containing heterocyclic compound not including a silicon atom may include, in the ring, a heteroatom other than the nitrogen atom, such as an oxygen atom and a sulfur atom, may have aromaticity, or may be a compound in which two or more rings are single-bonded or are bonded through a polyvalent linking group of di- or higher valent. In addition, the above-described nitrogen-containing heterocyclic compound not including a silicon atom may have a substituent.

Examples of the above-described nitrogen-containing heterocyclic compound not including a silicon atom include pyridine, pyridazine, pyrazine, pyrimidine, triazine, tetrazine, pyrrole, pyrazole, imidazole, triazole, tetrazole, oxazole, isoxazole, thiazole, isothiazole, oxadiazole, thiadiazole, quinoline, isoquinolin, cinnoline, phthalazine, quinoxalin, quinazoline, indole, indazole, benzoimidazole, benzotriazole, benzoxazole, benzoisoxazole, benzothiazole, benzoisothiazole, benzoxadiazole, benzothiadiazole, saccharin, pyrrolidine, and piperidine.

In addition, examples of the above-described silylated heterocyclic compound include a silylated imidazole compound and a silylated triazole compound. Examples of the silylated heterocyclic compound include monomethylsilylimidazole, dimethylsilylimidazole, trimethylsilylimidazole, monomethylsilyltriazole, dimethylsilyltriazole, and trimethylsilyltriazole.

The above-described silylated heterocyclic compound may correspond to the above-described silylating agent, but in a case of being used as a catalyst, it means that the silylated heterocyclic compound is used in combination with other silylating agents other than the silylated heterocyclic compound.

In the above-described surface treatment agent composition, a concentration of the above-described silylating agent or the total concentration of the above-described silylating agent and the above-described catalyst may be, for example, 0.01% by mass to 100% by mass, preferably 0.1% by mass to 50% by mass and more preferably 0.5% by mass to 30% by mass with respect to 100% by mass of the above-described surface treatment agent composition.

The surface treatment agent composition can include a solvent.

The above-described solvent is not particularly limited as long as it dissolves the above-described silylating agent. As the solvent, for example, organic solvents such as hydrocarbons, esters, ethers, ketones, halogen element-containing solvents, sulfoxide-based solvents, alcohols, carbonate-based solvents, derivatives of polyhydric alcohol, nitrogen element-containing solvents, silicone solvents, and thiols are used. Among these, hydrocarbons, esters, ethers, halogen element-containing solvents, sulfoxide-based solvents, or derivatives of polyhydric alcohol, which do not have an OH group, are preferable.

These may be used alone or in combination of two or more kinds thereof.

Examples of the above-described hydrocarbons include linear, branched, or cyclic hydrocarbon-based solvents, aromatic hydrocarbon-based solvents, and terpene-based solvents, and specific examples thereof include n-hexane, n-heptane, n-octane, n-nonane, n-decane, n-undecane, n-dodecane, n-tetradecane, n-hexadecane, n-octadecane, n-icosane, branched hydrocarbon corresponding to the carbon numbers thereof (for example, isododecane, isocetane, and the like), cyclohexane, methylcyclohexane, decalin, benzene, toluene, xylene, (ortho-, meta-, or para-)diethylbenzene, 1,3,5-trimethylbenzene, naphthalene, mesitylene, p-menthane, o-menthane, m-menthane, diphenylmenthane, limonene, α-terpinene, β-terpinene, γ-terpinene, bornane, norbornane, pinane, α-pinene, β-pinene, carane, longifolene, abietane, and a terpene-based solvent.

Examples of the above-described esters include ethyl acetate, n-propyl acetate, i-propyl acetate, n-butyl acetate, i-butyl acetate, n-pentyl acetate, i-pentyl acetate, n-hexyl acetate, n-heptyl acetate, n-octyl acetate, n-pentyl formate, n-butyl propionate, ethyl butyrate, n-propyl butyrate, i-propyl butyrate, n-butyl butyrate, methyl n-octanate, methyl decanoate, methyl pyruvate, ethyl pyruvate, n-propyl pyruvate, methyl acetoacetate, ethyl acetoacetate, ethyl 2-oxobutanoate, dimethyl adipate, methyl 3-methoxypropionate, ethyl 3-methoxypropionate, methyl 3-ethoxypropionate, ethyl 3-ethoxypropionate, and ethyl ethoxyacetate.

In addition, as the above-described esters, cyclic esters such as a lactone compound may be used. Examples of the lactone compound include β-propiolactone, γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone, and ε-hexanolactone.

Examples of the above-described ethers include di-n-propyl ether, ethyl-n-butyl ether, di-n-butyl ether, ethyl-n-amyl ether, di-n-amyl ether, ethyl-n-hexyl ether, di-n-hexyl ether, di-n-octyl ether, diisopropyl ethers corresponding to the carbon numbers thereof, ethers with branched hydrocarbon groups, such as diisopropyl ether and diisoamyl ether, dimethyl ether, diethyl ether, methyl ethyl ether, methyl cyclopentyl ether, diphenyl ether, tetrahydrofuran, and dioxane.

Examples of the above-described ketones include acetone, acetylacetone, methyl ethyl ketone, methyl propyl ketone, methyl butyl ketone, 2-heptanone, 3-heptanone, cyclohexanenone, and isophorone.

Examples of the above-described halogen element-containing solvent include perfluorocarbons such as perfluorooctane, perfluorononane, perfluorocyclopentane, perfluorocyclohexane, and hexafluorobenzene; hydrofluorocarbons such as 1,1,1,3,3-pentafluorobutane, octafluorocyclopentane, 2,3-dihydrodecafluoropentane, and ZEORORA H (manufactured by ZEON CORPORATION); hydrofluoroethers such as methyl perfluoropropyl ether, methyl perfluoroisobutyl ether, methyl perfluorobutyl ether, ethyl perfluorobutyl ether, ethyl perfluoroisobutyl ether, methyl perfluorohexyl ether, ethyl perfluorohexyl ether, Asahiklin AE-3000 (manufactured by Asahi Glass Co., Ltd.), Novec HFE-7100, Novec HFE-7200, Novec 7300, and Novec 7600 (all manufactured by 3M); chlorocarbons such as tetrachloromethane; hydrochlorocarbons such as chloroform; chlorofluorocarbons such as dichlorodifluoromethane; hydrochlorofluorocarbons such as 1,1-dichloro-2,2,3,3,3-pentafluoropropane, 1,3-dichloro-1,1,2,2,3-pentafluoropropane, 1-chloro-3,3,3-trifluoropropene, and 1,2-dichloro-3,3,3-trifluoropropene; perfluoroether, and perfluoropolyether.

Examples of the above-described sulfoxide-based solvent include dimethyl sulfoxide.

Examples of the above-described carbonate-based solvent include dimethyl carbonate, ethylmethyl carbonate, diethyl carbonate, and propylene carbonate.

Examples of the above-described alcohols include methanol, ethanol, 1-propanol, 2-propanol, 1-butanol, 2-butanol, isobutanol, tert-butanol, 1-pentanol, 2-pentanol, 3-pentanol, 2-methyl-1-butanol, 3-methyl-1-butanol, 2-methyl-2-butanol, 3-methyl-2-butanol, 1-hexanol, 2-hexanol, 3-hexanol, 2-methyl-1-pentanol, 3-methyl-1-pentanol, 4-methyl-1-pentanol, 2-methyl-2-pentanol, 3-methyl-2-pentanol, 4-methyl-2-pentanol, 2-methyl-3-pentanol, 3-methyl-3-pentanol, 2,2-dimethyl-1-butanol, 3,3-dimethyl-1-butanol, 3,3-dimethyl-2-butanol, 2-ethyl-1-butanol, 1-heptanol, 2-heptanol, 3-heptanol, 4-heptanol, benzyl alcohol, 1-octanol, isooctanol, 2-ethyl-1-hexanol, and 4-methyl-2-pentanol.

Examples of the above-described derivative of polyhydric alcohol, which do not have an OH group, include ethylene glycol dimethyl ether, ethylene glycol diethyl ether, ethylene glycol dibutyl ether, ethylene glycol monomethyl ether acetate, ethylene glycol monoethyl ether acetate, ethylene glycol monobutyl ether acetate, ethylene glycol diacetate, diethylene glycol dimethyl ether, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol dimethyl ether, propylene glycol diethyl ether, propylene glycol dibutyl ether, propylene glycol monomethyl ether acetate, propylene glycol monoethyl ether acetate, propylene glycol monobutyl ether acetate, propylene glycol diacetate, dipropylene glycol dimethyl ether, dipropylene glycol methyl propyl ether, dipropylene glycol diethyl ether, dipropylene glycol dibutyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol dimethyl ether, butylene glycol monomethyl ether acetate, butylene glycol diacetate, glycerin triacetate, 3-methoxybutyl acetate, 3-methyl-3-methoxybutyl acetate, and 3-methyl-3-methoxybutyl propionate.

Examples of the above-described nitrogen element-containing solvent include formamide, N,N-dimethylformamide, N,N-dimethylacetamide, N-methyl-2-pyrrolidone, N-ethyl-2-pyrrolidone, N-propyl-2-pyrrolidone, 1,3-dimethyl-2-imidazolidinone, 1,3-diethyl-2-imidazolidinone, 1,3-diisopropyl-2-imidazolidinone, diethylamine, triethylamine, and pyridine.

Examples of the above-described silicone solvent include hexamethyldisiloxane, octamethyltrisiloxane, decamethyltetrasiloxane, and dodecamethylpentasiloxane.

Examples of the above-described thiols include 1-hexanethiol, 2-methyl-1-pentanethiol, 3-methyl-1-pentanethiol, 4-methyl-1-pentanethiol, 2,2-dimethyl-1-butanethiol, 3,3-dimethyl-1-butanethiol, 2-ethyl-1-butanethiol, 1-heptanethiol, benzylthiol, 1-octanethiol, 2-ethyl-1-hexanethiol, 1-nonanethiol, 1-decanethiol, 1-undecanethiol, 1-dodecanethiol, and 1-tridecanethiol.

The above-described solvent preferably includes an aprotic solvent. A content of the aprotic solvent is, for example, 80% by mass or more, preferably 90% by mass or more in 100% by mass of the above-described solvent. It is more preferable that the above-described solvent is the aprotic solvent, that is, the solvent includes the aprotic solvent in a content of 100% by mass in 100% by mass of the solvent.

Examples of the aprotic solvent hydrocarbons, esters, ethers, ketones, halogen element-containing solvents, sulfoxides, carbonate solvents, derivatives of polyhydric alcohol, nitrogen element-containing solvents, and silicone solvents. These may be used alone or in combination of two or more kinds thereof.

Among these, it is preferable to use one or two or more kinds selected from the group consisting of derivatives of polyhydric alcohol, hydrocarbons, and ethers.

From the viewpoint of cost and solubility, a derivative of polyhydric alcohol (however, those having no OH group in the molecule) are preferable, and for example, diethylene glycol monoethyl ether acetate, ethylene glycol monomethyl ether acetate, propylene glycol monomethyl ether acetate, diethylene glycol dimethyl ether, diethylene glycol ethyl methyl ether, diethylene glycol diethyl ether, diethylene glycol monomethyl ether acetate, diethylene glycol diacetate, triethylene glycol dimethyl ether, ethylene glycol diacetate, ethylene glycol dimethyl ether, 3-methoxy-3-methyl-1-butyl acetate, propylene glycol dimethyl ether, propylene glycol diethyl ether, propylene glycol dibutyl ether, propylene glycol monoethyl ether acetate, propylene glycol monobutyl ether acetate, propylene glycol diacetate, dipropylene glycol dimethyl ether, dipropylene glycol methyl propyl ether, dipropylene glycol diethyl ether, dipropylene glycol dibutyl ether, dipropylene glycol monomethyl ether acetate, dipropylene glycol monoethyl ether acetate, dipropylene glycol monobutyl ether acetate, or dipropylene glycol diacetate is preferable. In addition, propylene carbonate, a linear or branched hydrocarbon solvent having 6 to 12 carbon atoms, p-menthane, diphenylmenthane, limonene, terpinene, bornane, norbornane, pinane, or the like is also preferable.

As an example of the surface treatment agent composition including a silylating agent and a solvent, for example, compositions in which the silylating agent includes one or two or more kinds selected from the group consisting of hexamethyldisilazane, heptamethyldisilazane, N-(trimethylsilyl)dimethylamine, bis(dimethylamino)dimethylsilane, bis(trimethylsilyl)trifluoroacetamide, N-methyl-N-trimethylsilyltrifluoroacetamide, N-trimethylsilylacetamide, N-trimethylsilylimidazole, trimethylsilyltriazole, bistrimethylsilylsulfate, 2,2,5,5-tetramethyl-2,5-disila-1-azacyclopentane, 2,2,4,4,6,6-hexamethylcyclotrisilazane, hexamethyldisiloxane, trimethylsilyltrifluoroacetate, trimethylsilyltrifluoromethanesulfonate, trimethylsilylbenzenesulfonate, and trimethylsilyltoluenesulfonate, and the solvent includes one or two or more kinds selected from the group consisting of propylene carbonate, linear hydrocarbon solvents having 7 to 10 carbon atoms, menthane, pinane, γ-butyrolactone, propylene glycol monomethyl ether acetate, and 3-methoxy-3-methyl-1-butylacetate may be used.

The surface treatment agent composition may not contain water or may contain water in a content of 2% by mass or less in 100% by mass of the surface treatment agent composition. As described above, it is possible to use a surface treatment agent composition which does not substantially contain water.

The above-described surface treatment agent composition can include a component other than the above-described components as long as the object of the present invention is not impaired. Examples of other components include oxidizing agents such as hydrogen peroxide and ozone, surfactants, and antioxidants such as BHT.

The surface treatment agent composition according to the present embodiment is obtained by mixing each of the above-described components. The obtained mixed solution may be purified by using an adsorbent, a filter, or the like, as necessary. In addition, each of the components may be purified in advance by distillation, and then purified using an adsorbent, a filter, or the like.

The embodiments of the present invention have been described above, but these are examples of the present invention and various configurations other than the above can be adopted. In addition, the present invention is not limited to the above-described embodiments, and modifications, improvements, and the like within the range in which the object of the present invention can be achieved are included in the present invention.

EXAMPLES

Hereinafter, the present invention will be described in detail with reference to Examples, but the present invention is not limited to the description of Examples.

<Production of Surface Treatment Agent Composition>

(Surface Treatment Agent Composition 1)

N-(trimethylsilyl)dimethylamine (TMSDMA) and propylene glycol monomethyl ether acetate (PGMEA) were mixed at a liquid temperature of 25° C., and the mixture was stirred for 1 minute to prepare a surface treatment agent composition 1 including 1% by mass of TMSDMA as a silylating agent. For the surface treatment described later, the surface treatment agent composition 1 within 30 minutes after the preparation was used. Hereinafter, "within 30 minutes after the preparation" will be referred to as "immediately after the preparation".

(Surface Treatment Agent Composition 2)

N-(trimethylsilyl)dimethylamine (TMSDMA) and propylene glycol monomethyl ether acetate (PGMEA) were mixed at a liquid temperature of 25° C., and the mixture was stirred for 1 minute. Further, trifluoroacetic acid (TFA) was added thereto to be reacted with TMSDMA, thereby preparing a surface treatment agent composition 2 including 0.1% by mass of trimethylsilyltrifluoroacetate (TMSTFA) as the compound A and 1% by mass of TMSDMA as the silylating agent. For the surface treatment described later, the surface treatment agent composition 2 immediately after the preparation was used.

(Surface Treatment Agent Composition 3)

A surface treatment agent composition 3 was prepared by preparing in the same manner as in the surface treatment agent composition 2, except that TMSDMA was replaced with hexmethyldisilazane (HMDS). For the surface treatment described later, the surface treatment agent composition 3 immediately after the preparation was used.

(Surface Treatment Agent Compositions 4 to 37)

Surface treatment agent compositions 4 to 37 were prepared by preparing in the same manner as in the surface treatment agent composition 1, 2, or 3 described above, except the raw materials shown in Table 1 were used. For the surface treatment described later, the surface treatment agent compositions 4 to 37 immediately after the preparation were used. Abbreviations and compound names thereof in Table 1 are shown in Table 2.

<Preparation of Substrate for Backing Evaluation>

A silicon oxide wafer that included a main surface which had a surface having a smooth oxide film and had a bevel region existing on a periphery thereof and having an inclined surface (upper bevel) formed and an end face at an edge portion of the main surface, which formed 90 degrees to the main surface was prepared.

The prepared silicon oxide wafer was immersed in a 1% by mass aqueous solution of hydrofluoric acid for 10 minutes at room temperature, immersed in pure water for 1 minutes, immersed in 2-propanol (IPA) for 1 minutes at room temperature, and then finally dried to prepare a substrate for backing evaluation.

<Manufacturing of Pattern-Formed Substrate>

First, a convex structure having a plurality of substantially columnar convex portions which has an aspect ratio of 22 and a pattern width of 19 nm in a cross-sectional view at a pitch of 90 nm (total distance between the width of the convex portion and the adjacent distance between the convex portions) was formed on the surface, and a silicon substrate having a smooth region in which a pattern was not formed on the outer peripheral portion was prepared.

The surface of the prepared substrate was dry-cleaned by $UV/O_3$ irradiation. As a result, the above-described surface of the substrate was oxidized to be silicon oxide. From the above, a substrate on which the pattern was formed was prepared.

Hereinafter, the portion having the convex structure is referred to as a "pattern formation region".

The material of the main surface of the above-described substrate for backing evaluation and the main surface of the substrate on which the pattern was formed was the same (silicon oxide).

TABLE 1

| Surface treatment agent composition | Raw material: Component other than solvent: Type | % by mass | Solvent: Type | % by mass |
|---|---|---|---|---|
| 1 | TMSDMA | 1.0 | PGMEA | 99.0 |
| 2 | TMSDMA, TFA | 1.1, 0.1 | PGMEA | 98.8 |
| 3 | HMDS, TFA | 1.1, 0.1 | PGMEA | 98.8 |
| 4 | TMSTFA, TMS-TMG | 5.6, 0.4 | PGMEA | 94.0 |
| 5 | MSTFA, tBu-TMG | 6.0, 0.4 | Decane | 93.6 |
| 6 | Me3SiOCH3, methanesulfonic acid | 10.0, 0.5 | DiAE | 89.5 |
| 7 | MeSi(OCH3)3, methanesulfonic acid | 10.0, 0.5 | DiAE | 89.5 |
| 8 | HSiMe2OC2H5, methanesulfonic acid | 10.0, 0.5 | DiAE | 89.5 |
| 9 | Me3SiOC6H13, CF3S(═O)2O—Si(CH3)3 | 10.0, 0.5 | Decane | 89.5 |
| 10 | Me3Si—OC6H13, trifluoromethanesulfonic acid | 10.0, 0.01 | Decane | 89.99 |
| 11 | Me3Si—OMe, trifluoromethanesulfonic acid | 10.0, 10.0 | nPA | 80.0 |
| 12 | C8H17SiMe2OMe, trifluoromethanesulfonic acid | 10.0, 0.5 | DiAF | 89.5 |
| 13 | Hexamethyldisiloxane, trifluoromethanesulfonic acid | 5.0, 1.5 | Decane + PGMEA | 50, 43.5 |
| 14 | DBTMDS, (CF3CO)2O | 11.3, 9.2 | Decane + TPGDME | 69.5, 10.0 |
| 15 | DOTMDS, (CF3CO)2O | 13.1, 7.4 | DiAE + TPGDME | 69.5, 10.0 |
| 16 | HMDS, (CF3CO)2O | 9.2, 11.3 | Isododecane | 79.5 |
| 17 | HMDS, (CF3CO)2O | 1.0, 0.1 | PGMEA | 98.9 |
| 18 | TMSDMA, (CF3CO)2O | 2.7, 0.7 | PGMEA | 96.6 |
| 19 | HMDS, TMS-Cl | 1.0, 0.1 | PGMEA | 98.9 |
| 20 | ((CF3CH2CH2)Me2Si)2NH, TMSTFA | 1.0, 0.1 | PGMEA | 98.9 |
| 21 | (PhMe2Si)2NH, TMSTFA | 1.0, 0.1 | PGMEA | 98.9 |
| 22 | TMSDEA, TMSTFA | 1.0, 0.1 | PGMEA | 98.9 |
| 23 | TMSDMA, TMSTFA | 1.0, 0.1 | PGMEA | 98.9 |
| 24 | HMDS, TMSTFA | 10.0, 0.1 | PGMEA | 89.9 |
| 25 | HMDS | 10.0 | PGMEA | 90.0 |
| 26 | TMDS | 10.0 | nPA | 90.0 |
| 27 | TMSDMA | 10.0 | PGMEA | 90.0 |
| 28 | TMSDMA | 5.0 | Diethyl carbonate | 95.0 |
| 29 | TMSDMA | 0.1 | Decane | 99.9 |
| 30 | HMDS, TMSIm, (CF3CO)2O | 8.7, 0.2, 11.3 | Isododecane | 79.8 |
| 31 | MSTFA, DBU | 6.0, 0.4 | PGMEA | 93.6 |
| 32 | MSTFA, Im, TMS-Cl | 6.0, 0.2, 0.01 | PGMEA | 93.79 |
| 33 | MSTFA, N-MeIm | 6.0, 0.2 | PGMEA | 93.8 |
| 34 | TMSIm, TMSTFA | 1.0, 0.1 | PGMEA | 98.9 |
| 35 | TMS-TFA, DBN | 5.6, 0.3 | PGMEA | 94.1 |
| 36 | BSTFA, 2-MeIm | 3.9, 0.2 | PGMEA | 95.9 |
| 37 | TMSTFA, TMS-amide, N-MeIm | 10.0, 9.9, 0.1 | PGMEA | 80.0 |

| Surface treatment agent composition | Surface treatment composition: Silylating agent: Type | % by mass | Catalyst: Type | % by mass |
|---|---|---|---|---|
| 1 | TMSDMA | 1.0 | | |
| 2 | TMSDMA | 1.0 | TMSTFA | 0.1 |
| 3 | HMDS | 1.0 | TMSTFA | 0.1 |
| 4 | TMSTFA | 5.6 | TMS-TMG | 0.4 |
| 5 | MSTFA | 6.0 | tBu-TMG | 0.4 |
| 6 | Me3SiOCH3 | 10.0 | Methanesulfonic acid | 0.5 |
| 7 | MeSi(OMe)3 | 10.0 | Methanesulfonic acid | 0.5 |
| 8 | HSiMe2OC2H5 | 10.0 | Methanesulfonic acid | 0.5 |
| 9 | Me3SiOC6H13 | 10.0 | CF3S(═O)2OSiMe3 | 0.5 |
| 10 | Me3SiOC6H13 | 10.0 | Trifluoromethanesulfonic acid | 0.01 |
| 11 | Me3SiOMe | 10.0 | Trifluoromethanesulfonic acid | 10.0 |
| 12 | C8H17SiMe2OMe | 10.0 | Trifluoromethanesulfonic acid | 0.5 |
| 13 | Hexamethyldisiloxane | 5.0 | Trifluoromethanesulfonic acid | 1.5 |
| 14 | DBTMDS | 10.0 | BDMSTFA | 0.5 |
| 15 | DOTMDS | 10.0 | ODMSTFA | 0.5 |
| 16 | HMDS | 0.5 | TMSTFA | 10.0 |
| 17 | HMDS | 0.9 | TMSTFA | 0.1 |
| 18 | TMSDMA | 2.3 | TMSTFA | 0.5 |
| 19 | HMDS | 1.0 | TMS-Cl | 0.1 |
| 20 | ((CF3CH2CH2)Me2Si)2NH | 1.0 | TMSTFA | 0.1 |
| 21 | (PhMe2Si)2NH | 1.0 | TMSTFA | 0.1 |
| 22 | TMSDEA | 1.0 | TMSTFA | 0.1 |
| 23 | TMSDMA | 1.0 | TMSTFA | 0.1 |
| 24 | HMDS | 10.0 | TMSTFA | 0.1 |
| 25 | HMDS | 10.0 | | |
| 26 | TMDS | 10.0 | | |
| 27 | TMSDMA | 10.0 | | |

TABLE 1-continued

| | | | | |
|---|---|---|---|---|
| 28 | TMSDMA | 5.0 | | |
| 29 | TMSDMA | 0.1 | | |
| 30 | TMSIm | 0.2 | TMSTFA | 10.0 |
| 31 | MSTFA | 6.0 | DBU | 0.4 |
| 32 | MSTFA | 6.0 | Im, TMS-Cl | 0.2, 0.01 |
| 33 | MSTFA | 6.0 | N-MeIm | 0.2 |
| 34 | TMSIm | 1.0 | TMSTFA | 0.1 |
| 35 | TMSTFA | 5.6 | DBN | 0.3 |
| 36 | BSTFA | 3.9 | 2-MeIm | 0.2 |
| 37 | TMSTFA, TMS-amide | 10.0, 9.9 | N-MeIm | 0.1 |

TABLE 2

| Abbreviation | Chemical name |
|---|---|
| TMSTFA | trifluoroacetic acid trimethylsilyl ester |
| TMS-TMG | N-(trimethylsilyl)-tetramethylguanidine |
| MSTFA | N-methyl-N-trimethylsilyltrifluoroacetamide |
| tBu-TMG | N-(tert-butyl)-diphenylguanidine |
| DBTMDS | 1,3-di-n-butyl-1,1,3,3-tetramethyldisilazane |
| DOTMDS | 1,3-di-n-octyl-1,1,3,3-tetramethyldisilazane |
| HMDS | 1,1,1,3,3,3-hexamethyldisilazane |
| TMSDMA | N-(trimethylsilyl)-dimethylamine |
| TMS-Cl | chlorotrimethylsilane |
| TMSDEA | N-(trimethylsilyl)-dimethylamine |
| TMDS | 1,1,3,3-tetramethyldisilazane |
| TMSIm | N-(trimethylsilyl)-imidazole |
| DBU | 1,8-diazabicyclo[5.4.0]-7-undecene |
| Im | imidazole |
| N-MeIm | N-methyl-imidazole |
| DBN | 1,5-diazabicyclo[4.3.0]-5-nonene |
| BSTFA | N,O-bis(trifluoromethyl)trifluoroacetamide |
| 2-MeIm | 2-methyl-imidazole |
| TMS-amide | N-(trimethylsilyl)-trifluoroacetamide |
| PGMEA | propylene glycol monomethyl ether acetate |
| DiAE | Diisoamylether |
| nPA | 1-propanol |
| TPGDME | Tripropylene glycol dimethyl ether |
| BDMSTFA | n-butyldimethylsilyl trifluoroacetate |
| ODMSTFA | n-octyldimethylsilyl trifluoroacetate |

In the table, Me represents a methyl group (—CH3).

<Surface Treatment of Substrate>

Examples I-1 to I-37 and Comparative Example I-1

The above-described substrate was placed on a spin coater, and while rotating the substrate at a speed of 200 rpm, IPA, the surface treatment agent composition shown in Table 1, and IPA were discharged in this order at a rate of 200 cc/min. An attempt was made to shake off the IPA by continuing the rotation even after the discharge was stopped.

In Comparative Example I-1, the above-described discharge with the surface treatment agent composition was not performed, and other than that, the same treatment as in Examples I-1 to I-37 was performed.

Examples W-1 to W-37 and Comparative Example 2

The above-described substrate was placed on a spin coater, and while rotating the substrate at a speed of 200 rpm, IPA, the surface treatment agent composition shown in Table 1, and water were discharged in this order at a rate of 200 cc/min. An attempt was made to shake off the water by continuing the rotation even after the discharge was stopped.

In Comparative Example W-1, the above-described discharge with the surface treatment agent composition was not performed, and other than that, the same treatment as in Examples W-1 to W-37 was performed.

<Evaluation of Backing of IPA, Backing of Water, IPA Receding Contact Angle, Water Receding Contact Angle, IPA Contact Angle, and Water Contact Angle>

The substrate for backing evaluation obtained in the above-described "Surface treatment of substrate" was taken out from the spin coater, and a distance of backing from the end face of the substrate was measured. The measurement was performed at 8 places at equal intervals, and the average value thereof was calculated. The average values of the backing distance are shown in Tables 3 and 4.

Further, after drying the above-described substrate, approximately 3 μL of IPA was dropped thereon while the substrate was set on a contact angle meter at the room temperature of 25° C. and stood on a horizontal table, and a contact angle in a case where the IPA droplet was naturally dried and the droplet size decreased (contact angle (°) 60 seconds later after IPA dropping) was measured as an IPA receding contact angle. The IPA receding contact angles are shown in Tables 3 and 4.

In addition, after drying the above-described substrate, 30 μl of pure water was dropped thereon while the substrate was set on a contact angle meter at the room temperature of 25° C. and stood on a horizontal table, and the pure water is sucked at a rate of 6 μl/sec to reduce the droplet size. Contact angles of the droplet during this process were continuously measured, and a contact angle when the droplet size decreased without changing the contact angle was measured as a water receding contact angle. The water receding contact angles are shown in Tables 3 and 4.

In addition, using the substrate with which the IPA receding contact angle was measured, approximately 1 μL of IPA was dropped thereon while the substrate after drying was set on a contact angle meter and stood on a horizontal table, the state of the droplet after 5 seconds was observed, and a contact angle (°) at this time was measured as an IPA contact angle. The IPA contact angles are shown in Tables 3 and 4.

In addition, using the substrate with which the water receding contact angle was measured, approximately 1 μL of pure water was dropped thereon while the substrate after drying was set on a contact angle meter and stood on a horizontal table, the state of the droplet after 5 seconds was observed, and a contact angle (°) at this time was measured as a water contact angle. The water contact angles are shown in Tables 3 and 4.

<Evaluation of Pattern Collapse Rate>

In "Surface treatment of substrate" for the above-described substrate on which the pattern was formed, after the final discharge with IPA, the substrate was dried while discharging $N_2$ to the substrate. In the pattern formation region of the above-described substrate, the number of convex portions where the collapse occurred was counted by observing with an electron microscope (SEM, SU8010 manufactured by Hitachi High-Tech Corporation) at a magnification such that the convex portions were in a field of view of 500 to 600 lines. Tables 3 and 4 show a proportion of the convex portions in which the collapse occurred to the total convex portion as a pattern collapse rate (%).

TABLE 3

| | Surface treatment agent composition | Evaluation result: IPA receding contact angle [°] | Backing of IPA [mm] | IPA contact angle [°] | Pattern collapse rate [%] |
|---|---|---|---|---|---|
| Example I-1 | 1 | 9 | 9 | 4 | 6 |
| Example I-2 | 2 | 11 | 9 | 5 | 5 |
| Example I-3 | 3 | 10 | 9 | 4 | 5 |
| Example I-4 | 4 | 10 | 9 | 5 | 5 |
| Example I-5 | 5 | 9 | 9 | 4 | 5 |
| Example I-6 | 6 | 9 | 9 | 4 | 6 |
| Example I-7 | 7 | 7 | 11 | 2 | 8 |
| Example I-8 | 8 | 9 | 9 | 4 | 5 |
| Example I-9 | 9 | 10 | 9 | 5 | 5 |
| Example I-10 | 10 | 9 | 9 | 4 | 5 |
| Example I-11 | 11 | 8 | 9 | 3 | 7 |
| Example I-12 | 12 | 7 | 11 | 2 | 21 |
| Example I-13 | 13 | 10 | 9 | 5 | 5 |
| Example I-14 | 14 | 9 | 9 | 6 | 13 |
| Example I-15 | 15 | 8 | 9 | 6 | 13 |
| Example I-16 | 16 | 10 | 9 | 5 | 5 |
| Example I-17 | 17 | 9 | 9 | 4 | 5 |
| Example I-18 | 18 | 10 | 9 | 5 | 5 |
| Example I-19 | 19 | 9 | 9 | 4 | 6 |
| Example I-20 | 20 | 9 | 9 | 4 | 8 |
| Example I-21 | 21 | 8 | 9 | 5 | 5 |
| Example I-22 | 22 | 9 | 9 | 4 | 5 |
| Example I-23 | 23 | 9 | 9 | 4 | 5 |
| Example I-24 | 24 | 10 | 9 | 5 | 5 |
| Example I-25 | 25 | 7 | 11 | 2 | 9 |
| Example I-26 | 26 | 8 | 9 | 3 | 7 |
| Example I-27 | 27 | 9 | 9 | 4 | 5 |
| Example I-28 | 28 | 9 | 9 | 4 | 5 |
| Example I-29 | 29 | 8 | 9 | 3 | 11 |
| Example I-30 | 30 | 10 | 9 | 5 | 5 |
| Example I-31 | 31 | 10 | 9 | 5 | 5 |
| Example I-32 | 32 | 10 | 9 | 5 | 5 |
| Example I-33 | 33 | 10 | 9 | 5 | 5 |
| Example I-34 | 34 | 9 | 9 | 4 | 5 |
| Example I-35 | 35 | 11 | 9 | 6 | 5 |
| Example I-36 | 36 | 7 | 11 | 2 | 9 |
| Example I-37 | 37 | 10 | 9 | 5 | 5 |
| Comparative Example I-1 | Not surface-treated | <1 | 14 | <1 | 100 |

TABLE 4

| | Surface treatment agent composition | Evaluation result: Water receding contact angle [°] | Backing of water [mm] | Water contact angle [°] | Pattern collapse rate [%] |
|---|---|---|---|---|---|
| Example W-1 | 1 | 70 | 8 | 75 | 6 |
| Example W-2 | 2 | 82 | 5 | 87 | 5 |
| Example W-3 | 3 | 80 | 6 | 85 | 5 |
| Example W-4 | 4 | 88 | 5 | 93 | 5 |
| Example W-5 | 5 | 79 | 6 | 84 | 5 |
| Example W-6 | 6 | 71 | 8 | 76 | 6 |
| Example W-7 | 7 | 55 | 8 | 60 | 8 |
| Example W-8 | 8 | 72 | 8 | 80 | 5 |
| Example W-9 | 9 | 87 | 5 | 92 | 5 |
| Example W-10 | 10 | 79 | 6 | 84 | 5 |
| Example w-11 | 11 | 67 | 8 | 72 | 7 |
| Example W-12 | 12 | 50 | 9 | 60 | 21 |
| Example W-13 | 13 | 83 | 6 | 88 | 5 |
| Example W-14 | 14 | 88 | 5 | 100 | 13 |
| Example W-15 | 15 | 81 | 6 | 104 | 13 |
| Example W-16 | 16 | 85 | 6 | 90 | 5 |
| Example W-17 | 17 | 77 | 6 | 82 | 5 |
| Example W-18 | 18 | 87 | 5 | 92 | 5 |
| Example W-19 | 19 | 73 | 8 | 78 | 6 |
| Example W-20 | 20 | 79 | 6 | 84 | 8 |
| Example W-21 | 21 | 79 | 6 | 86 | 5 |
| Example W-22 | 22 | 79 | 6 | 84 | 5 |
| Example W-23 | 23 | 77 | 6 | 82 | 5 |
| Example W-24 | 24 | 83 | 6 | 88 | 5 |
| Example W-25 | 25 | 51 | 9 | 56 | 9 |
| Example W-26 | 26 | 66 | 8 | 71 | 7 |
| Example W-27 | 27 | 75 | 6 | 80 | 5 |
| Example W-28 | 28 | 74 | 8 | 79 | 5 |
| Example W-29 | 29 | 66 | 8 | 71 | 11 |
| Example W-30 | 30 | 88 | 5 | 93 | 5 |
| Example W-31 | 31 | 88 | 5 | 93 | 5 |
| Example W-32 | 32 | 88 | 5 | 93 | 5 |
| Example W-33 | 33 | 89 | 5 | 94 | 5 |
| Example W-34 | 34 | 77 | 6 | 82 | 5 |
| Example W-35 | 35 | 91 | 5 | 96 | 5 |
| Example W-36 | 36 | 52 | 9 | 57 | 9 |
| Example W-37 | 37 | 83 | 6 | 88 | 5 |
| Comparative Example W-1 | Not surface-treated | <1 | 13 | <1 | 100 |

As shown in Tables 3 and 4, in Examples I-1 to I-37 and Examples W-1 to W-37 using the surface treatment agent compositions 1 to 37, an IPA receding contact angle of a predetermined value or more and a water receding contact angle of a predetermined value or more were exhibited. As shown in Tables 3 and 4, the backing of the rinsing solution could be reduced as compared with Comparative Example I-1 and Comparative Example W-1, where were not treated with the surface treatment agent composition.

In addition, as shown in Tables 3 and 4, in Examples I-1 to I-37 and Examples W-1 to W-37 using the surface treatment agent compositions 1 to 37, an IPA contact angle of a predetermined value or more and a water contact angle of a predetermined value or more could be exhibited, and as shown in Tables 3 and 4, a good pattern collapse suppressing effect was exhibited as compared with Comparative Example I-1 and Comparative Example W-1.

Priority is claimed on Japanese Patent Application No. 2020-089228, filed May 21, 2020, and Japanese Patent Application No. 2020-089232, filed May 21, 2020, the disclosures of which are incorporated herein by reference.

REFERENCE SIGNS LIST

10: substrate
12: main surface
14: notch portion
16: back surface
20: concave-convex structure
22: convex portion
24: concave portion
30: pattern formation region
32: pattern non-formation region
50: bevel region
51: top edge

52: upper bevel
53: front shoulder
54: end face
55: lower bevel
60: surface treatment agent composition
70: surface treatment agent layer

The invention claimed is:

1. A treatment method of treating a main surface of a semiconductor substrate that has, on the main surface of the substrate, a pattern formation region in which a pattern having a concave-convex structure with a pattern dimension of 30 nm or less is formed and a bevel region formed on a periphery of the pattern formation region and including an inclined surface formed on the main surface, the method comprising:

a surface treatment step comprising bringing a surface treatment agent composition including a silylating agent and a solvent into contact with the pattern formation region and the bevel region on the main surface of the semiconductor substrate by a spin method, and after the surface treatment step, a step comprising bringing the main surface of the semiconductor substrate into contact with a rinsing solution, and shaking off the rinsing solution using a spin method, wherein the surface treatment agent composition exhibits an IPA receding contact angle obtained by the following procedure of 3° or more at a room temperature of 25° C., and/or a water receding contact angle obtained by the following procedure of 40° or more at the room temperature of 25° C., and wherein;

the surface treatment agent composition is brought into contact with a smooth surface of a silicon oxide substrate of which surface is composed of silicon oxide to perform a surface treatment, and with respect to the surface-treated surface of the silicon oxide substrate in a state of being stood on a horizontal table, 3 μl of 2-propanol is dropped on the surface at the room temperature of 25° C. and a value of a contact angle 60 seconds later after the dropping is measured and defined as the IPA receding contact angle (°), and 30 μl of pure water is dropped on the surface at the room temperature of 25° C., the pure water is sucked at a rate of 6 μl/sec, and a value of a contact angle while a droplet size is decreasing is measured and defined as the water receding contact angle (°).

2. The treatment method according to claim 1, wherein the solvent includes an aprotic solvent.

3. The treatment method according to claim 2, wherein the solvent includes the aprotic solvent in a content of 100% by mass in 100% by mass of the solvent.

4. The treatment method according to claim 2, wherein the aprotic solvent includes one or two or more kinds selected from the group consisting of hydrocarbons, esters, ethers, ketones, halogen element-containing solvents, sulfoxides, carbonate solvents, derivatives of polyhydric alcohol, nitrogen element-containing solvents, and silicone solvents.

5. The treatment method according to claim 2, wherein the solvent includes at least one of following (i), (ii) and (iii), (i) a carbonate solvent or a lactone (ii) propylene carbonate or γ-butyrolactone, and (iii) a derivative of polyhydric alcohol.

6. The treatment method according to claim 1, wherein the silylating agent includes a silicon compound represented by General Formula [1], $$R^1_aSi(H)_bX_{4-a-b} \quad [1]$$

(in General Formula [1], $R^1$'s each independently represent an organic group including a hydrocarbon group having 1 to 18 carbon atoms, in which a part or all of hydrogen elements may be replaced with fluorine elements, X's each independently represent a monovalent functional group in which an element bonded to an Si element is nitrogen, oxygen, carbon, or halogen, a represents an integer of 1 to 3, b represents an integer of 0 to 2, and a sum of a and b is 1 to 3).

7. The treatment method according to claim 1, wherein the silylating agent has a trialkylsilyl group, or an element bonded to an Si element, or both are nitrogen.

8. The treatment method according to claim 1, wherein a content of the silylating agent is 0.1% by mass or more and 50% by mass or less in 100% by mass of the surface treatment agent composition.

9. The treatment method according to claim 1, wherein the surface treatment agent composition includes a catalyst.

10. The treatment method according to claim 9, wherein the catalyst includes one or two or more kinds selected from the group consisting of trimethylsilyltrifluoroacetate, trimethylsilyltrifluoromethanesulfonate, dimethylsilyltrifluoroacetate, dimethylsilyltrifluoromethanesulfonate, butyldimethylsilyltrifluoroacetate, butyldimethylsilyltrifluoromethanesulfonate, hexyldimethylsilyltrifluoroacetate, hexyldimethylsilyltrifluoromethanesulfonate, octyldimethylsilyltrifluoroacetate, octyldimethylsilyltrifluoromethanesulfonate, decyldimethylsilyltrifluoroacetate, decyldimethylsilyltrifluoromethanesulfonate, a sulfonic acid represented by General Formula [3], an anhydride of the sulfonic acid, a salt of the sulfonic acid, a sulfonic acid derivative represented by General Formula [4], a sulfonate represented by General Formula [5], a sulfonimide represented by each of General Formulae [6] and [7], a sulfonimide derivative represented by each of General Formulae [8] and [9], a sulfonmethide represented by General Formula [10], a sulfonmethide derivative represented by General Formula [11], an acid imidized product, a nitrogen-containing compound, a nitrogen-containing heterocyclic compound, and a silylated heterocyclic compound, $$R^8—S(=O)_2OH \quad [3]$$

[in General Formula [3], R& represents a group selected from the group consisting of a monovalent hydrocarbon group having 1 to 8 carbon atoms, in which a part or all of hydrogen elements may be replaced with fluorine elements, and a hydroxyl group]

$$R^{8'}—S(=O)_2O—Si(H)_{3-r}(R^9)_r \quad [4]$$

[in General Formula [4], $R^8$ represents a monovalent hydrocarbon group having 1 to 8 carbon atoms, in which a part or all of hydrogen elements may be replaced with fluorine elements, $R^9$'s each independently represent at least one group selected from monovalent hydrocarbon groups having 1 to 18 carbon atoms, in which a part or all of hydrogen elements may be replaced with fluorine elements, and r represents an integer of 1 to 3]

$$R^{10}—S(=O)_2OR^{11} \quad [5]$$

[in General Formula [5], $R^{10}$ represents a group selected from the group consisting of a monovalent hydrocarbon group having 1 to 8 carbon atoms, in which a part or all of hydrogen elements may be replaced with fluorine elements, and a fluorine element, and $R^{11}$ represents a monovalent alkyl group having 1 to 18 carbon atoms]

$$(R^{12}—S(=O)_2)_2NH \quad [6]$$

[in General Formula [6], $R^{12}$'s each independently represent a group selected from the group consisting of a monovalent hydrocarbon group having 1 to 8 carbon atoms, in which a part or all of hydrogen elements may be replaced with fluorine elements, and a fluorine element]

[7]

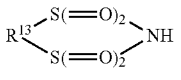

[in General Formula [7], $R^{13}$ represents a divalent hydrocarbon group having 1 to 8 carbon atoms, in which a part or all of hydrogen elements may be replaced with fluorine elements]

$$((R^{14}—S(=O)_2)_2N)_sSi(H)_t(R^{15})_{4-s-t} \quad [8]$$

[in General Formula [8], $R^{14}$'s each independently represent a group selected from the group consisting of a monovalent hydrocarbon group having 1 to 8 carbon atoms, in which a part or all of hydrogen elements may be replaced with fluorine elements, and a fluorine element, $R^{15}$'s each independently represent a monovalent hydrocarbon group having 1 to 18 carbon atoms, in which a part or all of hydrogen elements may be replaced with fluorine elements, s represents an integer of 1 to 3, t represents an integer of 0 to 2, and a sum of s and tis 3 or less]

[9]

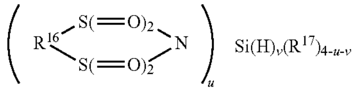

[in General Formula [9], $R^{16}$'s each independently represent a divalent hydrocarbon group having 1 to 8 carbon atoms, in which a part or all of hydrogen elements may be replaced with fluorine elements, $R^{17}$'s each independently represent a monovalent hydrocarbon group having 1 to 18 carbon atoms, in which a part or all of hydrogen elements may be replaced with fluorine elements, u represents an integer of 1 to 3, v represents an integer of 0 to 2, and a sum of u and v is 3 or less]

$$(R^{18}—S(=O)_2)_3CH \quad [10]$$

[in General Formula [10], $R^{18}$'s each independently represent a group selected from the group consisting of a monovalent hydrocarbon group having 1 to 8 carbon atoms, in which a part or all of hydrogen elements may be replaced with fluorine elements, and a fluorine element]

$$((R^{19}—S(=O)_2)_3C)_wSi(H)_x(R^{20})_{4-w-x} \quad [11]$$

[in General Formula [11], $R^{19}$'s each independently represent a group selected from the group consisting of a monovalent hydrocarbon group having 1 to 8 carbon atoms, in which a part or all of hydrogen elements may be replaced with fluorine elements, and a fluorine element, $R^{20}$'s each independently represent a monovalent hydrocarbon group having 1 to 18 carbon atoms, in which a part or all of hydrogen elements may be replaced with fluorine elements, w represents an integer of 1 to 3, x represents an integer of 0 to 2, and a sum of w and x is 3 or less].

11. The treatment method according to claim 9, wherein a content of the catalyst is 0.005% by mass or more and 20% by mass or less in 100% by mass of the surface treatment agent composition.

12. The treatment method according to claim 1, wherein the surface treatment agent composition does not contain water or contains water in a content of 2% by mass or less in 100% by mass of the surface treatment agent composition.

13. The treatment method according to claim 1, wherein the IPA receding contact angle is 5° or more at the room temperature of 25° C., and/or the water receding contact angle is 50° or more at the room temperature of 25° C.

14. The treatment method according to claim 1, wherein an IPA contact angle measured by the following procedure is 2° or more and 10° or less at the room temperature of 25° C., and/or a water contact angle measured by the following procedure is 50° or more at the room temperature of 25° C., and wherein;

the surface treatment agent composition is brought into contact with a smooth surface of a silicon oxide substrate of which surface is composed of silicon oxide to perform a surface treatment, and with respect to the surface-treated surface of the silicon oxide substrate in a state of being stood on a horizontal table, 1 μl of 2-propanol is dropped on the surface at the room temperature of 25° C. in a state of a droplet and a value of a contact angle 5 seconds later after the dropping is measured and defined as the IPA contact angle (°), and 1 μl of pure water is dropped on the surface at the room temperature of 25° C. and a value of a contact angle 5 seconds later after the dropping is measured and defined as the water contact angle (°).

15. The treatment method according to claim 1, further comprising, after the surface treatment step:

a removal step of removing a surface treatment agent layer formed on the main surface of the semiconductor substrate from the main surface, the surface treatment agent layer being formed by the surface treatment step.

* * * * *